United States Patent
Lee et al.

(10) Patent No.: US 8,711,614 B1
(45) Date of Patent: *Apr. 29, 2014

(54) MEMORY ELEMENTS WITH INCREASED WRITE MARGIN AND SOFT ERROR UPSET IMMUNITY

(75) Inventors: Andy L. Lee, San Jose, CA (US); Irfan Rahim, Milpitas, CA (US); Lu Zhou, Santa Clara, CA (US); Madhuri Mailavaram, Milpitas, CA (US); Srinivas Perisetty, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 177 days.

This patent is subject to a terminal disclaimer.

(21) Appl. No.: 13/052,374

(22) Filed: Mar. 21, 2011

Related U.S. Application Data

(63) Continuation of application No. 12/391,230, filed on Feb. 23, 2009, now Pat. No. 7,920,410.

(51) Int. Cl.
*G11C 11/34* (2006.01)
(52) U.S. Cl.
USPC ............................... 365/177; 365/63; 365/226
(58) Field of Classification Search
USPC ............................ 365/156, 226, 154, 63, 177
See application file for complete search history.

(56) References Cited

U.S. PATENT DOCUMENTS

| | | | |
|---|---|---|---|
| 4,852,060 A | 7/1989 | Rockett, Jr. | |
| 5,307,142 A | 4/1994 | Corbett et al. | |
| 5,504,703 A | 4/1996 | Bansal | |
| 5,631,863 A | 5/1997 | Fechner et al. | |
| 6,172,907 B1 * | 1/2001 | Jenne | 365/185.18 |
| 6,275,080 B1 | 8/2001 | Phan et al. | |
| 6,477,097 B2 | 11/2002 | Inoue | |
| 6,975,041 B2 | 12/2005 | Hirano et al. | |
| 7,233,518 B2 | 6/2007 | Liu | |
| 7,352,610 B1 | 4/2008 | Pedersen et al. | |
| 7,366,006 B2 | 4/2008 | Zhang | |
| 7,872,903 B2 | 1/2011 | Pedersen | |
| 7,920,410 B1 * | 4/2011 | Lee et al. | 365/154 |
| 2002/0130348 A1 | 9/2002 | Tran | |
| 2005/0259462 A1 | 11/2005 | Wood | |
| 2006/0262612 A1 | 11/2006 | Lovett | |
| 2007/0002619 A1 * | 1/2007 | Schoenauer et al. | 365/185.08 |
| 2007/0069305 A1 * | 3/2007 | Kuboyama et al. | 257/369 |

(Continued)

OTHER PUBLICATIONS

Calin et al., "Upset Hardened Memory Design for Submicron CMOS Technology", IEEE Transactions on Nuclear Science, vol. 43, No. 6, Dec. 1996.

(Continued)

*Primary Examiner* — Hoai V Ho
(74) *Attorney, Agent, or Firm* — Treyz Law Group; Vason Tsai

(57) ABSTRACT

Memory elements are provided that exhibit immunity to soft error upset events when subjected to radiation strikes such as high-energy atomic particle strikes. The memory elements may each have four inverter-like transistor pairs that form a bistable element and a pair of address transistors. There may be four nodes in the transistor each of which is associated with a respective one of the four inverter-like transistor pairs. There may be two control transistors each of which is coupled between the transistors in a respective one of the inverter-like transistor pairs. During data writing operations, the two control transistors may be turned off to temporarily decouple the transistors in two of the four inverter-like transistor pairs.

19 Claims, 12 Drawing Sheets

(56) References Cited

U.S. PATENT DOCUMENTS

| | | |
|---|---|---|
| 2007/0153566 A1* | 7/2007 | Boemler .................. 365/154 |
| 2008/0087927 A1 | 4/2008 | Shin et al. |
| 2009/0147603 A1* | 6/2009 | Houston et al. ............ 365/203 |
| 2010/0080033 A1* | 4/2010 | Xu et al. .................... 365/72 |
| 2010/0238715 A1* | 9/2010 | Pedersen .................. 365/156 |
| 2011/0242880 A1* | 10/2011 | White ....................... 365/154 |

OTHER PUBLICATIONS

Rahim et al., U.S. Appl. No. 12/571,346, filed Sep. 30, 2009.
Xu et al., U.S. Appl. No. 61/113,576, filed Nov. 11, 2008.
Rahim et al., U.S. Appl. No. 12/568,638, filed Sep. 28, 2009.
Xu et al., U.S. Appl. No. 12/571,143, filed Sep. 30, 2009.

* cited by examiner

MEMORY ELEMENTS WITH INCREASED WRITE MARGIN AND SOFT ERROR UPSET IMMUNITY

This application is a continuation of patent application Ser. No. 12/391,230, filed Feb. 23, 2009, now U.S. Pat. No. 7,920, 410 which is hereby incorporated by reference herein in its entirety.

BACKGROUND

This invention relates to memory elements, and more particularly, to volatile memory elements for integrated circuits such as programmable logic devices.

Integrated circuits often contain memory elements. Typical memory elements are based on cross-coupled inverters (latches). A memory element retains data only so long as the integrated circuit is powered. In the event of power loss, the data in the memory element is lost. Although nonvolatile memory elements such as memory elements based on electrically-erasable programmable read-only memory technology are not subject to data loss in this way, it is often not desirable or possible to fabricate nonvolatile memory elements as part of a given integrated circuit.

As a result, volatile memory elements are often used. For example, static random-access memory (SRAM) chips contain SRAM cells, which are a type of volatile memory element. Volatile memory elements are also used in programmable logic device integrated circuits.

Volatile memory elements are subject to a phenomenon known as soft error upset. Soft error upset events are caused by cosmic rays and radioactive impurities embedded in integrated circuits and their packages. Cosmic rays and radioactive impurities generate high-energy atomic particles such as neutrons and alpha particles. The memory elements contain transistors and other components that are formed from a patterned silicon substrate. When an atomic particle strikes the silicon in the memory element, electron-hole pairs are generated. The electron-hole pairs create a conduction path that can cause a charged node in the memory element to discharge and the state of the memory element to flip. If, for example, a "1" was stored in the memory element, a soft error upset event could cause the "1" to change to a "0."

Upset events in an integrated circuit corrupt the data stored in the memory elements and can have serious repercussions for system performance. In certain system applications such as remote installations of telecommunications equipment, it is extremely burdensome to repair faulty equipment. Unless programmable logic devices and other integrated circuits demonstrate good immunity to soft error upset events, they will be unsuitable for these types of applications.

It would therefore be desirable to be able to provide volatile memory elements that demonstrate satisfactory soft error upset performance for integrated circuits such as programmable logic device integrated circuits.

SUMMARY

Integrated circuits with static random-access memory cells are provided. The integrated circuits may be programmable integrated circuits, memory chips, or other suitable integrated circuits. The memory cells may be used as static random-access memory (SRAM) or, in programmable integrated circuits, the memory cells may be used as configuration random-access memory (CRAM). When used as CRAM cells, static output signals from the memory elements may be applied to the gates of programmable logic transistors to configure the transistors to perform desired logic functions.

Each memory cell may be formed from two or more transistor pairs. Each transistor pair may form an inverter-like circuit having a p-channel metal-oxide-semiconductor (PMOS) transistor connected in series with an n-channel metal-oxide-semiconductor transistor (NMOS) between a positive power supply terminal and ground. The p-channel metal-oxide-semiconductor transistor and the re-channel metal-oxide-semiconductor transistor in each transistor pair are connected at a node. The transistor pairs may be connected in a pattern that forms a bistable memory element. In this pattern, each transistor pair has gate control lines that are connected to the nodes in adjacent transistor pairs.

In addition, each memory cell may have one or more control transistors (also sometimes referred to as write enable transistors, read-write control transistors, or write transistors) each of which is associated with a respective one of the transistor pairs. The control transistors can be coupled in series with the transistors in some or all of the transistor pairs. With one suitable arrangement, each of the control transistors may be a PMOS transistor coupled between the two transistors in a respective transistor pair. With another suitable arrangement, each of the control transistors may be a PMOS transistor coupled between a PMOS transistor in a respective transistor pair and a positive power supply line (Vcc). If desired, some or all of the control transistors may be implemented using NMOS transistors. The control transistors may be controlled using one or more control signals such as address signals provided on address lines (word lines). When the control transistors are turned off (e.g., during write operations), the memory cell is less resistant to state changes, which facilitates write operations.

Memory cells that have three or more transistor pairs may be particularly resistant to soft error upset events due to radiation strikes (e.g., from high energy particles). Even if one node in a cell of this type is disturbed, other nodes in the memory cell remain undisturbed, allowing the memory cell to recover and thereby retain its original state.

Each memory cell may have one or more address transistors. For example, each cell may have a pair of address transistors. The address transistors may be controlled using a pair of address signals on respective address lines (word lines). Data lines may be used to convey data to and from the memory cells. For example, a single data line (bitline) may be connected to the cell through the pair of address transistors. During data writing operations, the address transistors may be controlled in parallel to load data into the memory cell and the control signals for the two control transistors may be deasserted to temporarily decouple the PMOS and NMOS transistors in two of the transistor pairs in the memory cell (e.g., to disable the inverter-like circuits formed by the transistors in the transistor pairs associated with the control transistors). This weakens the cell's resistance to state changes and makes it easier to write data into the cell.

To enhance write margin, the power supply voltage to the cell may be lowered temporarily during writing and/or the address signals may be overdriven. If desired, data signals carried on the data line may be overdriven. For example, if data "1's" are normally represented by a Vcc value of 1.0 volts, the data write signals may have an overdrive voltage of 1.2 volts (as an example). In general, overdriven signals may also include signals that are sometimes referred to as under-driven signals (e.g., signals with a normal ground signal value of 0.0 volts that are "underdriven" to a negative voltage such as −0.2 volts). Underdriving a signal by lowering its ground voltage in this way may enhance write margin and therefore serves as a type of overdrive scheme.

During data read operations, one of the address transistors may be used to read data from the memory cell and one of the address transistors may remain off to help prevent an undesired cell upset. With another suitable arrangement, both of the address transistors may be used in parallel to read data from the memory cell to help ensure that the data read operation is successful (e.g., that the data line is pulled sufficiently high or low by the memory cell). During normal operation, both address transistors may be turned off and the output of the cell may be used to configure programmable logic.

If desired, memory cells may be provided that have fewer than four interconnected transistor pairs. For example, cells may be provided that have two interconnected transistor pairs (cross-coupled inverters) or three interconnected transistor pairs. As with cells based on four interconnected transistor pairs, cells with fewer interconnected transistor pairs may be provided with control transistors. During data read operations and during normal operation in a circuit, the control transistors may be turned on. In this configuration, the interconnected pairs of transistors form a bistable memory element that stores data. In a programmable logic device or other programmable circuit, for example, the bistable memory element may store configuration data for configuring programmable logic. The configuration data may be applied to the gate of a transistor or other programmable logic circuit element. During data write operations, the control transistors can be turned off. When the control transistors are off, the memory cell is made less stable and is less resistant to state changes. For example, it may be easier to write a logic "0" (e.g., data "zeros") onto certain nodes in the cell because the transistors that would normally hold these nodes high are electrically disconnected when the control transistors are off. It may be easier to write a logic "1" (e.g., data "ones") onto these nodes, because the logic "1" can be overdriven (e.g., represented by elevated positive voltages) without generating undesirable leakage currents into the positive power supply rail.

Transistor layouts for the memory cells may be provided that create a physical separation between the internal nodes in the cell. In the event of a radiation strike in the vicinity of one node, the voltages on other nodes will not be immediately affected and will be able to help the cell recover without flipping its state. Spaces that are generated in the layout pattern to create the physical separation may be used for implementing other circuitry for the integrated circuit in which the memory cells are contained. For example, if the memory cell is being implemented as part of a programmable integrated circuit that uses configurable multiplexers, the transistor layout for the memory cells can include multiplexer transistors in the otherwise unoccupied spaces between the memory cell transistors. With one suitable arrangement, a transistor layout may include two interleaved CRAM cells. This type of arrangement may allow internal nodes of the two CRAM cells to be physically separated in an efficient manner (e.g., without consuming excessive circuit area).

Further features of the invention, its nature and various advantages will be more apparent from the accompanying drawings and the following detailed description of the preferred embodiments.

DETAILED DESCRIPTION

The present invention relates to integrated circuit memory elements. The memory elements may exhibit enhanced write margins and, in some embodiments, enhanced resistance to soft error upset events. Methods for using such memory elements are also provided. The memory elements, which are sometimes referred to as cells, may contain any suitable number of transistors. With one suitable arrangement, each cell contains twelve transistors. Arrangements with other numbers of transistors may also be used.

The memory elements can be used in any suitable integrated circuits that use memory. These integrated circuits may be memory chips, digital signal processing circuits with memory arrays, microprocessors, application specific integrated circuits with memory arrays, programmable integrated circuits such as programmable logic device integrated circuits in which memory elements are used for configuration memory, or any other suitable integrated circuit. For clarity, the present invention will sometimes be described in the context of programmable logic device integrated circuits. This is, however, merely illustrative. Memory cells in accordance with embodiments of the present invention may be used in any suitable circuits.

On integrated circuits such as memory chips or other circuits in which memory is needed to store processing data, the memory elements can be used to perform the functions of static random-access memory (RAM) cells and are sometimes referred to as SRAM cells. In the context of programmable logic device integrated circuits, the memory elements can be used to store configuration data and are therefore sometimes referred to in this context as configuration random-access memory (CRAM) cells.

Figure 1:
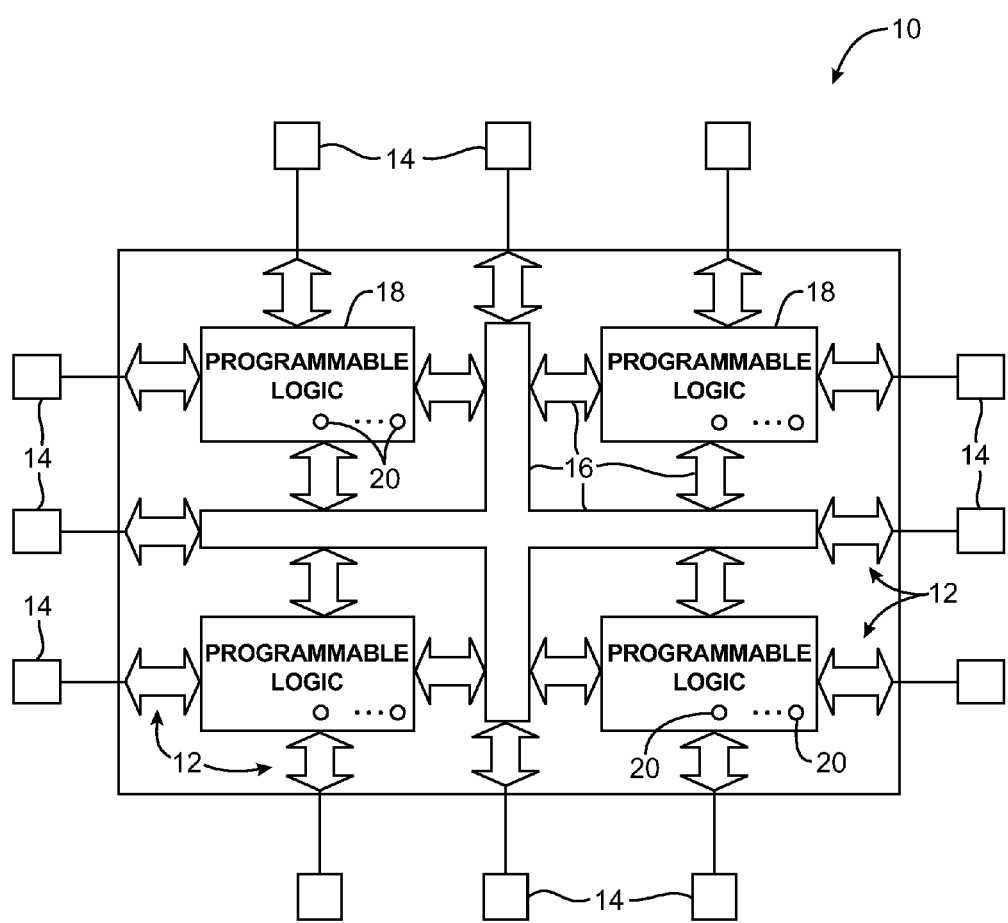
FIG. 1 is a diagram of an illustrative integrated circuit that may contain random-access memory cells in accordance with an embodiment of the present invention.

An illustrative integrated circuit such as a programmable logic device 10 in accordance with an embodiment of the present invention is shown in FIG. 1.

Device 10 may have input/output circuitry 12 for driving signals off of device 10 and for receiving signals from other devices via input/output pins 14. Interconnection resources 16 such as global and local vertical and horizontal conductive lines and busses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18.

Programmable logic device 10 contains volatile memory elements 20 that can be loaded with configuration data (also called programming data) using pins 14 and input/output circuitry 12. Once loaded, the memory elements each provide a corresponding static control output signal that controls the state of an associated logic component in programmable logic 18. If desired, memory elements 20 may be used in SRAM-type memory arrays (e.g., to store data for processing circuitry during operation of device 10).

Each memory element 20 may be formed from a number of transistors configured to form a bistable circuit. With one suitable approach, complementary metal-oxide-semiconductor (CMOS) integrated circuit technology is used to form the memory elements 20, so CMOS-based memory element implementations are described herein as an example. If desired, other integrated circuit technologies may be used to form the memory elements and the integrated circuit in which the memory elements are used to form memory arrays.

The memory elements may be loaded from an external erasable-programmable read-only memory and control chip or other suitable data source via pins 14 and input/output circuitry 12. Loaded CRAM memory elements 20 may provide static control signals that are applied to the terminals (e.g., gates) of circuit elements (e.g., metal-oxide-semiconductor transistors) in programmable logic 18 to control those elements (e.g., to turn certain transistors on or off) and thereby configure the logic in programmable logic 18. The circuit elements may be transistors such as pass transistors, parts of multiplexers, look-up tables, logic arrays, AND, OR, NAND, and NOR logic gates, etc.

The memory elements 20 may be arranged in an array pattern. In a typical modern programmable logic device, there may be millions of memory elements 20 on each chip. During programming operations, the array of memory elements is provided with configuration data by a user (e.g., a logic designer). Once loaded with configuration data, the memory elements 20 produce static control signals at their outputs that selectively control portions of the circuitry in the programmable logic 18 and thereby customize its functions so that it will operate as desired.

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

Figure 2:
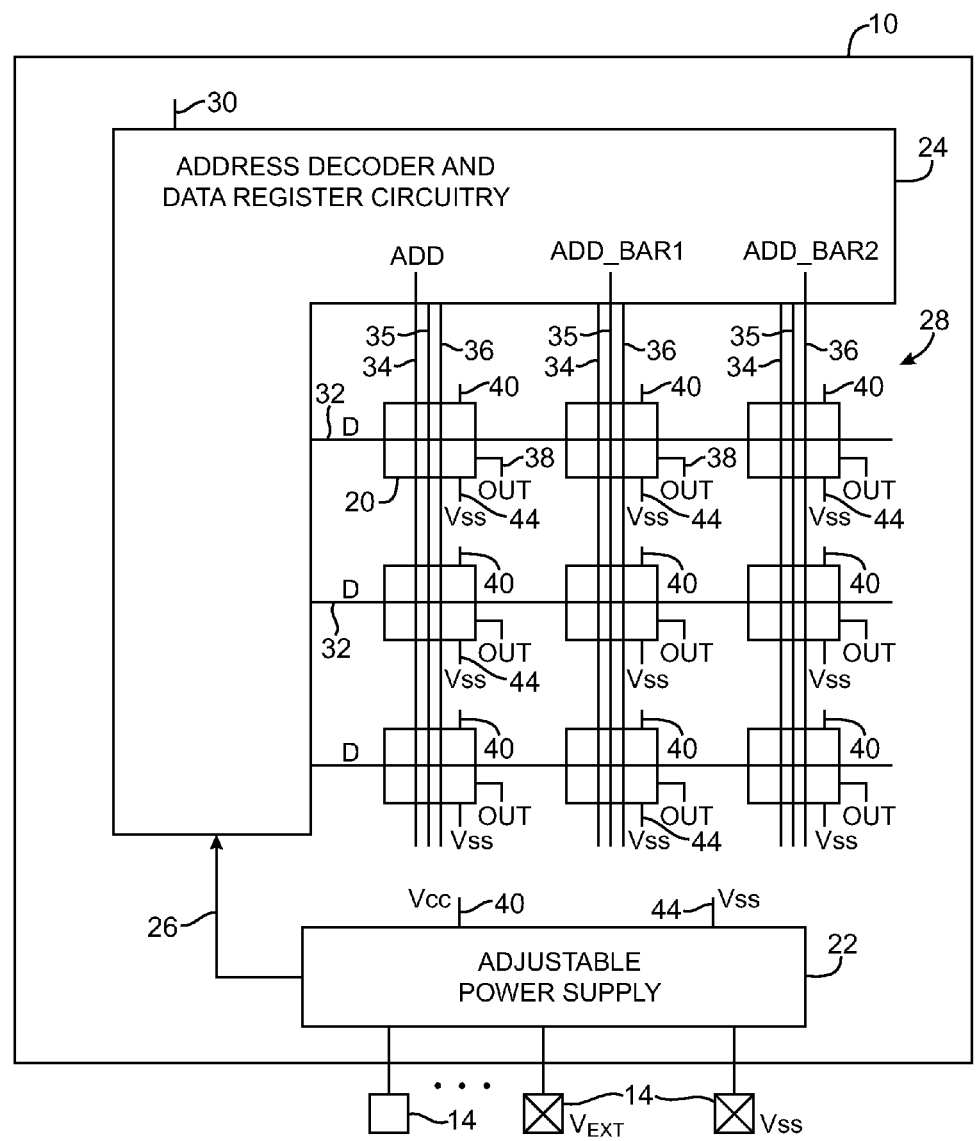
FIG. 2 is a diagram of an illustrative array of memory cells in accordance with an embodiment of the present invention.

When memory elements 20 are arranged in an array, horizontal and vertical conductors and associated loading circuitry may be used to load the memory elements with configuration data. Any suitable memory array architecture may be used for memory elements 20. One suitable arrangement is shown in FIG. 2. As shown in FIG. 2, integrated circuit 10 may have power regulator circuitry 22. Power regulator circuitry 22 may receive external voltages via pins 14. For example, power regulator circuitry may receive one or more positive power supply voltages such as Vext and a ground voltage Vss (e.g., 0 volts). Examples of positive power supply voltages that may be received include a 0.9 volt positive power supply voltage, a 1.2 volt positive power supply voltage, a 1.5 volt positive power supply voltage, a 2.5 volt positive power supply voltage, etc.

Adjustable power supply circuit 22 may produce internal power supply voltages on its outputs. These power supply voltages may include one or more positive power supply voltages (e.g., 0.9 volts, 1.0 volts, 1.2 volts, 1.5 volts, etc.) supplied on one or more respective power supply paths such as path 40 and a ground power supply voltage Vss (e.g., 0 volts) supplied on a ground path such as path 44. One or more of these voltages may be provided to address decoder and data register circuitry 24 via paths such as path 26. Adjustable power supply circuit 22 may produce elevated power supply voltages such as one or more overdrive voltages. Device 10 may utilize overdrive voltages during certain operations such as memory element writing operations when elevated address and/or data signal strengths may help improve write margin. Elevated power supply voltages may be used in powering some or all of the circuitry for a memory cell during data read operations and/or during normal operation (e.g., to elevate the static output control signal that is provided to associated programmable logic transistors).

Circuitry 24 may be used to read and write data from memory cell array 28. When array 28 is being used as regular SRAM, data write operations may be performed when it is desired to store processing results and data read operations may be performed when it is desired to retrieve stored data. When array 28 is being used as CRAM, data write operations may be performed to load configuration data and data read operations may be performed to confirm that configuration data loading operations have been performed successfully. During normal operation, when CRAM cells are neither being written to or read from, the static output of each CRAM cell can be used to control a respective programmable logic component such as a transistor.

Array 28 may include rows and columns of memory cells 20. In the example of FIG. 2, there are three rows and three columns of memory elements 20 in array 28. This is merely illustrative. Integrated circuits such as integrated circuit 10 may have any suitable number of memory elements 20. A typical memory array might, as an example, have thousands or millions of memory elements 20 arranged in hundreds or thousands or rows and columns.

Lines such as lines 32, 34, 35, 36, 38, 40, and 44 may be used to distribute signals in array 28. For example, paths such as path 40 may be used to convey power supply signals such as a positive power supply signal Vcc, reduced power supply signals, and elevated power supply signals from supply 22 to cells 20 and paths such as path 44 may be used to convey ground power supply signals such as a ground power supply signal Vss (e.g., 0 volts and/or a reduced ground voltage) from supply 22 to cells 20. In an array of cells 20 that is being used as configuration memory, output signals OUT for controlling programmable logic components can be provided on output lines 38.

Lines such as lines 32 may be used to load data D into cells 20 and may be used to read data out from cells 20. Lines 32 may sometimes be referred to as data lines or bitlines. If desired, each path 32 may have a first data line that carries a data signal and a second complimentary data line that carries the logical inverse of that data signal (e.g., lines 32 may be differential data lines or differential bitlines). Lines 34, 35, and 36 may be used to convey control signals such as address signals and are sometimes referred to as address lines or word lines.

During data write operations, write drivers in circuitry 24 may drive data onto lines 32. During read operations, lines 32 may be used to convey data from addressed cells 20 in array 28 to sense amplifiers in circuitry 24. The sense amplifiers may use a differential sensing scheme. With this type of scheme, a sense amplifier may compare the signal on a given data line to a reference data line. In preparation for the data read operation, data lines may be precharged to a known value (e.g., a voltage of 1.5 volts). When a sufficient voltage drop is detected on the given data line relative to the reference data line by the sense amplifier during a read, circuitry 24 can conclude that the cell from which data is being read contains a logic zero. When no voltage drop is detected, circuitry 24 can conclude that the cell from which data is being read contains a logic one. In general, any suitable data reading circuitry may be used. For example, data reading circuitry in circuitry 54 may not include sense amplifiers.

Address (control) signals ADD, ADD_BAR1, and ADD_BAR2 may be used to address cells 20 in array 28 during reading and writing. With one suitable arrangement, signals ADD, ADD_BAR1, and ADD_BAR2 may each be asserted (taken high or low depending on the type of transistor they are each controlling) during data write operations and only one of these signals (e.g., ADD_BAR1 or ADD_BAR2) may be asserted during data read operations while the remaining signals are deasserted. For example, signal ADD may be taken high during data write operations and be taken low during data read and normal operations, whereas signals ADD_BAR1 and ADD_BAR2 may be taken low during data write and data read operations and may remain high during normal operations. If desired, device 10 may only have two address lines such as address line 34 and address line 35, so that signals ADD and ADD_BAR1 would be asserted during data writing operations and only signal ADD_BAR1 would be asserted during data read operations. Other combinations of control signals may also be used.

Power regulator circuitry 22 may generate static or time-varying power supply signals on one or more power supply outputs such as positive power supply path 40 and ground power supply path 44. For example, power regulator circuitry 22 may generate a time-varying positive power supply voltage on path 40. Power regulator circuitry 22 may, for example, temporarily lower Vcc from 1.5 volts to 1.2 volts during write operations to weaken cells 20. Lowering Vcc during data loading facilitates data writing and helps to increase write margin. Circuitry 22 can also be used to elevate Vcc or related power supply voltages (e.g., to increase read margin or static output voltages).

With one suitable arrangement, power regulator circuitry 22 may temporarily generate an overdrive voltage (e.g., by raising one or more positive power supply voltages from Vcc and/or lowering Vss). This overdrive voltage can be used in supplying signals to data lines 32, address lines 34, 35, and 36, power supply rails for memory cells 20, and/or power supply terminals of address transistors of memory cells 20. Raising Vcc and/or lowering Vss for data lines 32, address lines 34, 35, and 36, power supply rails for memory cells 20, and/or power supply terminals of address transistors can facilitate data writing and reading.

Arrangements in which power regulator circuitry 22 generates an overdrive voltage by lowering one or more ground power supply voltages from Vss are sometimes referred to as underdrive arrangements. As an example, underdrive voltages may be applied to address lines 35 and 36 to facilitate data writing and/or data reading operations. In general, underdrive voltages may be beneficial when it is desired to strongly assert (i.e., turn on) p-channel metal-oxide-semiconductor (PMOS) transistors, whereas overdrive voltages may be beneficial when it is desired to strongly assert n-channel metal-oxide-semiconductor (NMOS) transistors.

Address decoder and data register circuitry 24 may use the power supply signals on path 26 or other suitable power sources to generate fixed signals or signals with time-varying magnitudes.

Circuitry 24 may control data loading operations for array 28. Circuitry 24 may receive data such as configuration data from external sources via input path 30. In a typical programmable logic device system, configuration data is loaded into a programmable logic device from a memory and data loading circuit. This type of circuit, which is sometimes referred to as a configuration device, loads configuration data into registers within circuitry 24. Address decoder circuits in circuitry 24 may receive external control signals or addressing control signals can be generated internally in circuitry 24. Address (control) signals for cells 20 are labeled ADD, ADD_BAR1, and ADD_BAR2 in FIG. 2. Signals ADD, ADD_BAR1, and ADD_BAR2 may be controlled independently during reading and writing and are typically controlled independently in each column.

Configuration data may be loaded into registers in circuitry 24 in series. These registers may then apply the configuration data (signals D) to array 28 over lines 32 (or over true and complementary data lines D and ND in differential data schemes). Address decoder circuitry in circuitry 24 may receive addressing information via input 30. The address decoder circuitry can then systematically assert desired address lines 34, 35, and 36. As the address signal ADD in a given column is asserted (e.g., taken high) and the address signals ADD_BAR1 and ADD_BAR2 in the given column are asserted (e.g., taken low), the data on the data lines 32 is loaded into the memory elements 20 in that column. By addressing each column in this way, the entire array 28 may be loaded with configuration data.

After the array has been loaded, address signals ADD, ADD_BAR1, and ADD_BAR2 may be deasserted and the output 38 of each memory element 20 may produce a corresponding static control signal OUT for controlling the gate of a pass transistor or other logic component in the programmable logic 18 of the programmable logic device 10 (FIG. 1).

Address signal ADD serves as a write enable signal, or read/write control signal. ADD has one value during write operations and another value during read operations. Signal ADD may be deasserted during data read operations, while desired address signals ADD_BAR1 and ADD_BAR2 are asserted to address desired cells 20. With one suitable arrangement, only address signal ADD_BAR1 may be asserted during data reading operations (e.g., while maintaining address signal ADD_BAR2 high). During read operations, the resulting data on data lines 32 is monitored (e.g., using sense amplifier circuitry in circuitry 24 or using other suitable circuitry in circuitry 24).

Figure 3:
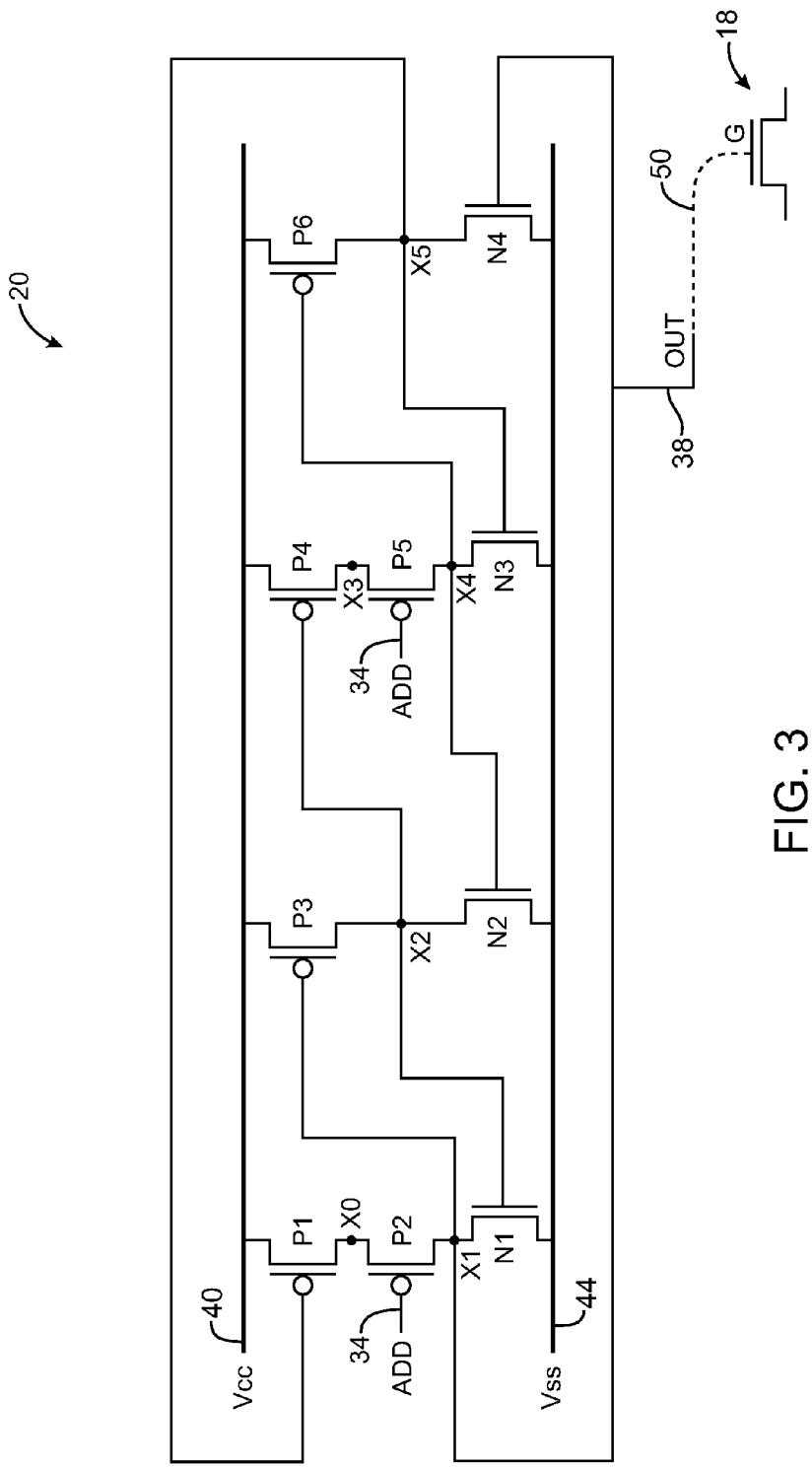
FIG. 3 is a diagram of an illustrative memory cell in accordance with an embodiment of the present invention.

A memory element 20 of the type that may be used in array 28 of FIG. 2 is shown in FIG. 3. As shown in FIG. 3, memory element 20 may have p-channel metal-oxide-semiconductor (PMOS) transistors P1, P2, P3, P4, P5, and P6 and n-channel metal-oxide-semiconductor (NMOS) transistors N1, N2, N3, and N4. Memory element 20 may also have NMOS and/or PMOS address transistors (not shown in FIG. 3) coupled to one or more nodes such as nodes X0, X2, X4, and X5. Each transistor in memory element 20 may have a source S, a drain D, a body B, and a gate G. The sources and drains of the transistors are sometimes collectively referred to as source-drain terminals.

During normal operation, output signal OUT on line 38 may be used as a static control signal to control programmable logic (e.g., by being applied to the gate G of a programmable logic metal-oxide-semiconductor transistor 18 by path 50 as shown in FIG. 3).

Unlike conventional memory element designs that are based on a pair of cross-coupled inverters, memory element 20 of FIG. 3 has four inverter-like pairs of transistors that are connected in a ring (first pair P1/N1, second pair P3/N2, third pair P4/N3, and fourth pair P6/N4). Two of the four pairs of transistors may sometimes be referred to as redundant pairs. In particular, the nodes associated with the second and fourth pairs of transistors may be referred to as redundant nodes. In general, redundant nodes are formed whenever two nodes of cell 20 are logically equivalent. In the FIG. 3 example, node X1 is logically equivalent to node X4 and node X2 is logically equivalent to node X5.

Memory element 20 may have two control transistors in two of the four inverter-like pairs of transistors. For example, cell 20 may have control transistor P2 between the transistors in the first pair and control transistor P5 between the transistors in the third pair of transistors. If desired, cell 20 may have different numbers of control transistors. For example, cell 20 may have only a single control transistor between one of the four inverter-like pairs of transistors (e.g., cell 20 may have only transistor P2 or transistor P5). The control transistors in the inverter-like pairs of transistors (e.g., transistors similar to P2 and P5) may be implemented using NMOS transistors. If desired, memory cell 20 may have one or more PMOS control transistors that are located between a node of cell 20 and a positive power supply line while also having one or more NMOS control transistors that located are between a node of cell 20 and a ground power supply line. With another suitable arrangement, memory cell 20 may have one or more NMOS control transistors that are coupled between a node of cell 20 and a positive power supply line and/or one or more PMOS control transistors that are coupled between a node of cell 20 and a ground power supply line.

In conventional cross-coupled inverter designs, there is a relatively strong likelihood that a radiation strike on an inverter's input node will cause the inverter's output to change states, thereby flipping the state of the cell to an erroneous value. In the arrangement of FIG. 3, the gate of the p-channel transistor in each transistor pair receives its input from a different source than the gate of the n-channel transistor in the same transistor pair. Because the control signals for the gates of the transistors are distributed in this way, memory cell 20 is better able to recover from a radiation strike on a particular node without flipping its state than conventional memory elements based on cross-coupled inverters.

There are six labeled nodes in memory element 20 of FIG. 3: X0, X1, X2, X3, X4, and X5. Any of these nodes may be used as output 38 of FIG. 2. For example, node X1 may be connected to output 38 of FIG. 2 as shown in FIG. 3.

Transistors P2 and P5 each couple together two nodes in memory element 20. With one suitable arrangement, transistors P2 and P5 serve as isolation elements that isolate certain nodes in element 20 during data writing operations and that electrically connect the nodes during other operations (i.e., during data reading and normal operations). For example, transistor P2 may selectively isolate or connect nodes X0 and X1 and transistor P5 may selectively isolate or connect nodes X3 and X4. This type of arrangement may help cell 20 to exhibit increased write margins. While transistors P2 and P5 are shown in FIG. 3 as being PMOS transistors, transistors P2 and P5 may be provided as NMOS transistors if desired (e.g., transistors P2 and P5 may be NMOS transistors connected in series with transistors N1 and N3, respectively). Transistors such as transistors P2 and P5 control the behavior of cell 20 during reading and writing operations and may therefore be referred to as read-write control transistors, write transistors, write enable transistors, isolation transistors, weakening transistors, decoupling transistors, etc.

With control transistors P2 and P5 on, cell 20 holds its loaded data value and exhibits good immunity to radiation-induced upset events.

Consider, as an example, the situation in which transistors P2 and P5 are on, nodes X0, X1, X3, and X4 are low (e.g., at a logic low "0" which may be equal to a ground voltage Vss), and nodes X2 and X5 are high (e.g., at a logic high "1" which may be equal to a power supply voltage Vcc). If radiation strikes node X1, radiation-induced charge on node X1 may cause the voltage on node X1 to go high (e.g., to positive power supply voltage Vcc or even higher). When the voltage on node X1 goes high, transistor N4 in transistor pair P6/N4 turns on. The voltage on node X4 is low, so transistor P6 is already on. With both transistor N4 and P6 on, the voltage on node X5 falls to a voltage between Vcc and Vss (e.g., to about Vcc/2 or even lower, which is roughly midway between the positive power supply voltage of Vcc applied to terminal 40 and the ground voltage Vss of 0 volts on ground terminal 44).

The high X1 voltage that was produced by the radiation strike is routed to the gate of p-channel metal-oxide-semiconductor transistor P3. This turns off transistor P3. N-channel metal-oxide-semiconductor transistor N2 has a gate controlled by the signal on node X4. Because node X4 is low, transistor N2 is off. When transistor P3 is turned off while transistor N2 is off, node X2 is no longer directly connected to either positive power supply voltage Vcc on positive power supply line 40 or ground voltage Vss on ground power supply line 44. Node X2 therefore floats, retaining its original high state, despite the radiation strike.

The unperturbed signal on node X2 serves as a control signal that is applied to the gate of transistor P4. Before the radiation strike, node X2 was high and transistor P4 was off. After the radiation strike, node X2 retains its original high state, so the state of transistor P4 is unchanged. Transistor N3 is controlled by a reduced high voltage (Vcc/2), but is able to hold node X4 low, because transistors P4 remains off. As with the unperturbed signal on node X2, the voltage on node X4 is therefore unperturbed by the radiation strike. Even though transistor P5 remains on in this situation (e.g., because the radiation strike did not impact address signal ADD), transistor P5 does not pull signal node X4 high, because transistor P4 remains off and node X3 remains low.

Because the voltage on node X4 remains low, transistor P6 remains on and pulls node X5 high. Even though node X5 is momentarily reduced in voltage from Vcc to Vcc/2, the node X5 signal is still able to hold transistor P1 at least partially off, so that transistor N1, which is held on by unperturbed high signal on node X2, is able to pull node X1 low. Eventually, the radiation-induced charge on node X1 that momentarily elevated the voltage on node X1 will dissipate and node X1 will return to its normal (pre-strike) state of 0 volts. Once X1 reaches 0 volts, transistor N4 turns off and node X5 regains its pre-strike voltage of Vcc.

As this example demonstrates, the architecture of cell 20 allows the cell to retain its stored data value (a stored "0" in this example), even when a node in the cell is struck by radiation.

The immunity of cell 20 to undesired changes in state from radiation strikes helps to ensure that array 28 will exhibit stable operation in a variety of circumstances. However, this stability can make it challenging to write data into cell 20.

Transistors P2 and P5 may be used to facilitate data writing operations. For example, if nodes X0, X1, X3, and X4 are high ("1") before a data writing operation in which the state of cell 20 is to be flipped (e.g., nodes X0, X1, X3, and X4 are to be pulled low), the data writing operation can include turning off control transistors P2 and P5. This will effectively isolate node X0 from node X1 and node X3 from node X4. Because these nodes are isolated from each other, a logic low signal ("0") can be driven onto nodes X1 and X4 without having to overcome transistors P1 and P4 (which were turned on before the data writing operation and were pulling nodes X1 and X4 to Vcc). Because nodes X1 and X4 can be pulled low without overcoming transistors P1 and P4, the states of transistor pairs P3/N2 and P6/N4 can be flipped (e.g., transistors P3 and P6 can be turned on and transistors N2 and N4 can be turned off) with a relatively large write margin (e.g., without a requirement that address transistors in cell 20 which may be driven by ADD_BAR1 and ADD_BAR2 be able to overpower transistors P1 and P4.

If nodes X0, X1, X3, and X4 are low ("0") before a data writing operation in which the state of cell 20 is to be flipped (e.g., nodes X0, X1, X3, and X4 are to be pulled high), the data writing operation will involve driving a logic high signal onto nodes X1 and X4 of cell 20 (as an example). However, because transistors N1 and N3 were initially turned on (e.g., nodes X2 and X5 were high at "1"), the logic high signal will need to be driven onto nodes X1 and X4 with enough current strength to overcome transistors N1 and N3, which are pulling nodes X1 and X4 low. With one suitable arrangement, the logic high signal on the data line 32 that is being written into cell 20 may be provided as an overdriven data signal (e.g., a signal that have a voltage greater than Vcc) to help overcome the initial tendency of transistors N1 and N3 to pull the respective nodes low. If desired, the address transistors in cell 20 that are controlled by signals ADD_BAR1 and ADD_BAR2 (not shown in FIG. 3) may be configured to be stronger than transistors N1 and N3, to help the address transistors overpower transistors N1 and N3 when driving a "1" onto nodes X1 and X4. Address signals may also be overdriven and cell supply voltages may be lowered during writing. In general, any combination of these arrangements may be used to provide sufficient write margin.

If desired, control transistors P2 and P5 may be turned off when flipping the state of cell 20 from a state where node X1 is initially low. By turning off control transistors P2 and P5, it may be easier to overdrive data signals onto nodes X1 and X4. For example, if control transistors P2 and P5 were left on (e.g., ADD remained at Vss), the overdriven data signals may not be as effective as the overdriven data signals could cause leakage current to pass through transistors P1 and P2 and through P4 and P5 and dissipate through power supply line 40.

The resistance of cell 20 to changes in state can be weakened for write operations by lowering the magnitude of voltage Vcc on terminal 40. For example, if a nominal Vcc value of 1.5 volts is used during normal operation (as an example), the value of Vcc may be temporarily lowered to a reduced value of 1.2 volts (or other suitable voltage). The resistance of cell 20 to changes in state can also be weakened for write operations by raising the magnitude of voltage Vss on terminal 44. These arrangements weaken cell 20 and facilitates data loading.

Data loading may also be facilitated by ensuring that two or more of the nodes in cell 20 are driven in parallel through the address transistors.

Figure 4:
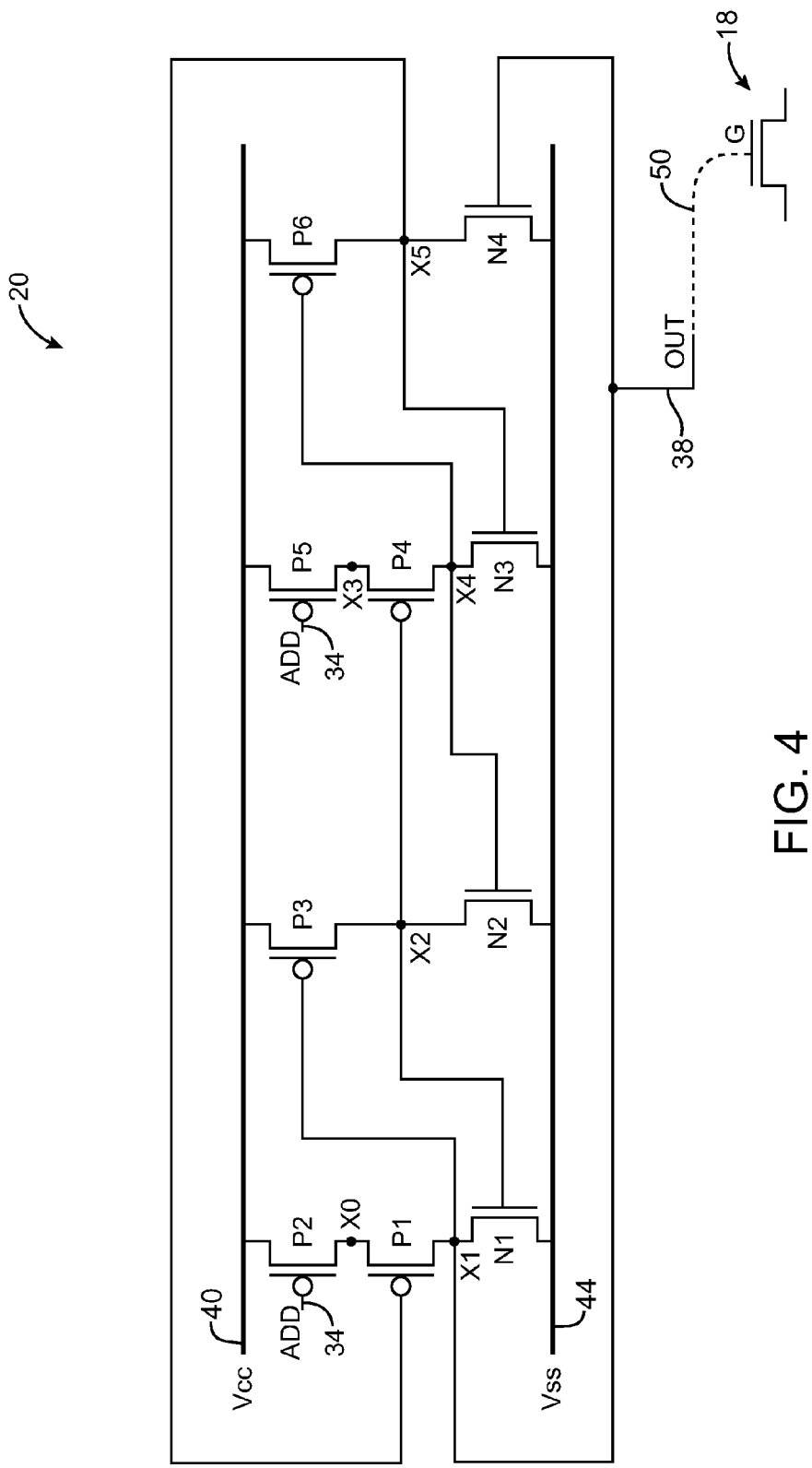
FIG. 4 is a diagram of an illustrative memory cell in which control transistors are directly coupled to a positive power supply line in accordance with an embodiment of the present invention.

Another implementation of memory element 20 is shown in FIG. 4. In the FIG. 4 arrangement, transistors P2 and P5 may be located between transistors P1 and P4 and power supply terminal 40. In contrast, in the FIG. 3 example, transistors P2 and P5 are located between transistors P1 and N1 and P4 and N3, respectively. While control transistors P2 and P5 of FIG. 4 are not located between the pairs of transistors that make up the inverter-like pairs of transistors (P1/N1 and P4/N3), control transistors P2 and P5 of FIG. 4 have a similar impact on cell 20 as transistors P2 and P5 of FIG. 3.

For example, during a write operation, transistors P2 and P5 of FIG. 4 may be turned off by taking ADD high. Because transistors P2 and P5 are turned off, nodes X1 and X4 will be decoupled from positive power supply line 40 even if transistors P1 and P4 are turned on (e.g., nodes X5 and X2 are at "0"). Decoupling nodes X1 and X4 from line 40 during data writing operations weakens cell 20 and facilitates data loading (e.g., increases the write margin of cell 20).

In particular, during a data writing operation in which a "0" is driven onto nodes X1 and X4, address transistors (not shown in FIG. 4) do not need to overcome transistors P1 and P4 (even if P1 and P4 are turned on) to pull nodes X1 and X4 low, because transistors P2 and P5 isolate nodes X1 and X4 from power supply line 40 (Vcc). Moreover, during a data writing operation in which a "1" is driven onto nodes X1 and X4, overdriven data signals (which may be greater than Vcc) may be driven onto nodes X1 and X4 to facilitate data writing. Because transistors P2 and P5 are turned off, these overdriven data signals will not dissipate into power supply line 40 (e.g., turning off P2 and P5 avoids undesirable leakage current).

As with the arrangement of FIG. 3, transistors P2 and P5 may be turned on during read operations and during normal operation.

The FIG. 4 arrangement is merely illustrative and, in general, any suitable arrangement for incorporating control transistors such as transistors P2 and P5 in cell 20 may be used.

Any suitable address transistor arrangement may be used for address cells 20. One, two, three, four, or more than four address transistors may be used. For example, a scheme may be used in which data line 32 is coupled to each cell 20 in a row of cells 20 through a respective single address transistor (i.e., a single transistor connected to an internal node such as node X1 in FIG. 3). Differential addressing scheme may also be used. For example, a data signal D may be conveyed to node X1 through a first address transistor and a complementary data signal ND may be conveyed to node X2 through a second address transistor. Signals D and ND may also be conveyed in parallel to nodes X1 and X2, respectively (e.g., using optional third and fourth address transistors). Arrangements in which at least two internal nodes (e.g., two of nodes X1, X2, X4, and X5 in FIG. 3) are coupled to address transistors may be desirable to ensure proper data loading (e.g., in the absence of overdrive signals and/or cell power supply voltage adjustments). An arrangement of this type is shown in FIG. 5.

Figure 5:
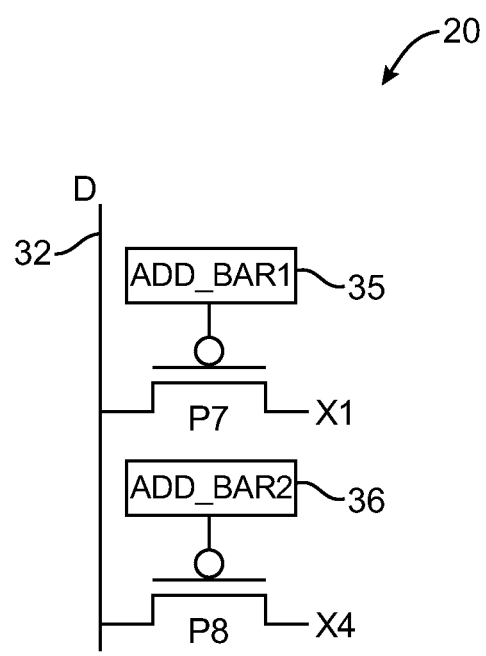
FIG. 5 is a diagram of illustrative address transistors that may be a part of a memory cell of the type shown in FIG. 3 or a memory cell of the type shown in FIG. 4 in accordance with an embodiment of the present invention.
Figure 10:
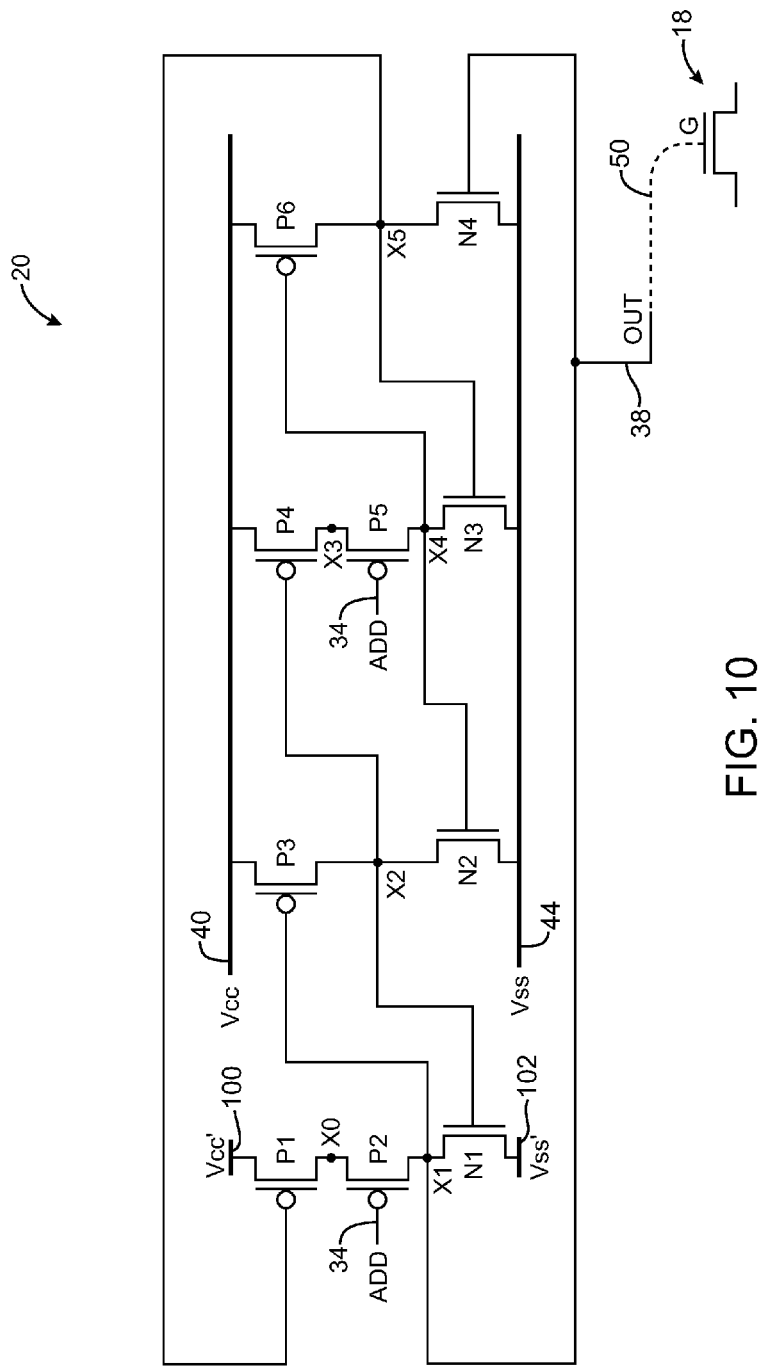
FIG. 10 is a diagram of an illustrative memory cell that has inverter-like pairs of transistors that are powered by a first set of power supply lines and that has at least one inverter-like pair of transistors that are powered by a second set of power supply lines in accordance with an embodiment of the present invention.

As shown in the example of FIG. 5, each memory cell 20 may include address transistors P7 and P8 connected to nodes X1 and X4 of FIG. 3, FIG. 4, or FIG. 10. Data D can be conveyed to cell 20 over a single data line 32 through address transistors P7 and P8.

Address signals ADD_BAR1 and ADD_BAR2 may be provided to the gates of respective address transistors P7 and P8 via address lines 35 and 36. The value of address signals ADD_BAR1 and ADD_BAR2 can be used to control address transistors P7 and P8, respectively. Transistors P7 and P8 may be turned off during normal operation by taking signals ADD_BAR1 and ADD_BAR2 high. In this situation, output signal OUT on line 38 of FIG. 3 (or FIG. 4) may be used as a static control signal to control programmable logic (e.g., by being applied to the gate G of a programmable logic metal-oxide-semiconductor transistor 18 by path 50 as shown in FIG. 3).

When it is desired to write data into cell 20, ADD, ADD_BAR1, and ADD_BAR2 may be asserted (i.e., ADD may be taken high to turn control transistors P2 and P5 off to weaken cell 20 and ADD_BAR1 and ADD_BAR2 may be taken low to turn on transistors P7 and P7 in configurations in which pass gates P7 and P8 are implemented using PMOS transistors). The voltage levels used for the asserted address signals may be lowered ("overdriven") with respect to normal power supply levels (e.g., taken below Vss) to improve write margin. If desired, write margin may be improved by lowering the magnitude of the power supply for cell 20 to weaken cell 20 during writing. The power to cell 20 may be lowered by lowering the magnitude of Vcc on terminal 40 from 1.5 volts to 1.2 volts (as an example) and/or by raising the magnitude of Vss on terminal 44 from 0.0 volts to 0.3 volts, as an example. When it is desired to read data from cell 20, signal ADD_BAR1 may be asserted (e.g., taken low), while signal ADD_BAR2 is deasserted (e.g., taken high). The use of two address transistors allows data to be written onto both logically equivalent nodes B and C at the same time, ensuring that the state of the cell can be disturbed sufficiently for data writing. The use of a single address transistor during read operations ensures that the state of the cell will not be disturbed as data is conveyed from the cell to data reading circuitry.

If desired, both address signals ADD_BAR1 and ADD_BAR2 may be asserted during data read operations to ensure that data line 32, which may be precharged, is pulled sufficiently high or low for data read operations to be successful. This type of arrangement may help to ensure that even if a single one of the transistors P7 or P8 is unusually weak due to a manufacturing process variation, the other transistor can help to ensure that the relatively weak transistor does not impede data read operations. Using multiple address transistors may reduce the impact if a "worst-case" local variation occurs on a single address transistor associated with cell 20. The probability of both address transistors associated with cell 20 being impacted with a "worst-case" variation is generally negligible.

During normal operation as CRAM memory, each cell 20 in array 28 may be used to provide a corresponding output signal OUT at its output line 38 as shown in FIGS. 3 and 4. The OUT signals may serve as static control signals that control programmable logic 18. In this mode of operation, the address signals ADD_BAR1 and ADD_BAR2 in each cell 20 are deasserted (e.g., ADD_BAR1 and ADD_BAR2 are high), so that address transistors P7 and P8 in each cell 20 are off. With address transistors P7 and P8 off, data signal line 32 will be isolated from the latch transistors in cell 20.

With transistors P7 and P8 off, cell 20 holds its loaded data value and exhibits good immunity to radiation-induced upset events.

The contents of cell 20 may be read by address decoder and data register circuitry 24 by taking one or both of the address signals low. When array 28 is used as an SRAM array, read operations may be performed to retrieve data for processing. When array 28 is used as a CRAM array, read operations may be performed to confirm that configuration data has been properly loaded into array 28.

The immunity of cell 20 to undesired changes in state from radiation strikes helps to ensure that array 28 will exhibit stable operation in a variety of circumstances. However, this stability can make it challenging to write data into cell 20.

The resistance of cell 20 to changes in state can be weakened for write operations by lowering the magnitude of voltage Vcc on terminal 40. For example, if a nominal Vcc value of 1.5 volts is used during normal operation (as an example), the value of Vcc may be temporarily lowered to a reduced value of 1.2 volts (or other suitable voltage). This weakens cell 20 and facilitates data loading. Write margin can also be increased by overdriving the address signals ADD_BAR1 and ADD_BAR2 (e.g., to a voltage below Vss) and by overdriving the data signal on line 32 (e.g., to a voltage below Vss or above Vcc as desired). In addition, data signals can be overdriven and control transistors P2 and P5 can be turned off to help to increase write margin (especially when writing a "0" onto nodes X1 and X4).

If desired, transistor body biases can be adjusted in cell 20 to modify the threshold voltages of some or all of the transistors and thereby enhance performance during writing, reading, and/or normal operations. For example, some or all of the NMOS transistors in cell 20 may be reverse-biased during data writing operations. Similarly, some or all of the PMOS transistors in cell 20 may be forward-biased during data writing operations. The PMOS transistors may be forward-biased in addition to or instead of reverse biasing the NMOS transistors. With one suitable arrangement, a body bias voltage that is less than Vss (e.g., a voltage such as Vss −0.5 volts) may be applied to body terminals of the NMOS transistors in cell 20 to reverse bias the NMOS transistors while a body bias voltage that is less than Vcc (e.g., a voltage such as Vcc −0.5 volts) may be applied to body terminals of the PMOS transistors in cell 20 to forward bias the PMOS transistors during data writing operations. This may increase the threshold voltages for transistors N1 and N3 and thereby weaken transistors N1 and N3 and may decrease the threshold voltages for transistors P7 and P8 and thereby strengthen transistors P7 and P8, thus helping to ensure that address transistors P7 and P8 of FIG. 5 can overcome NMOS transistors N1 and N3 when driving a "1" onto nodes X1 and X4 during a data writing operation in which nodes X1 and X4 were initially at "0" (as an example). This type of arrangement may be used to adjust transistor strengths in real time (e.g., based on body bias signals supplied by power supply 22) to help to increase write margins, to increase read margins, to reduce leakage currents, etc.

Data loading may also be facilitated by ensuring that two or more of the nodes in cell 20 are driven in parallel through the address transistors. In the example of FIG. 3, there are two address transistors P7 and P8 and these address transistors are respectively used to drive signals onto nodes X1 and X4 in parallel. Data signal D is loaded onto node X1 through transistor P7. At the same time, data signal D is loaded onto node X4 through transistor P8. If only one of these nodes was accessed during data loading operations, cell 20 would be more resistant to a state change. However, when both transistors P7 and P8 are used in parallel to drive data onto two nodes in cell 20, the state of cell 20 will change more easily.

If desired, the strengths of the signals in cell 20 can be varied. For example, the value of Vcc can be increased during normal operation to ensure that the value of OUT is sufficiently large to turn on associated programmable logic transistors in programmable logic 18. Temporarily lowered voltage levels (e.g., signals with reduced Vss values that are sometimes referred to as overdrive and/or underdrive signals) can also be used for address signals ADD, ADD_BAR1, ADD_BAR2, and data signal D. These signal-strength modification schemes may be used in place of or in combination with arrangements in which the cell voltage of Vcc is temporarily lowered (e.g. to 1.2 volts from a nominal value of 1.5 volts) and/or the voltage of Vss is temporarily raised (e.g., to 0.3 volts from 0.0 volts) on power supply rails 40 and 44 during data write operations.

It is not necessary for address transistors P7 and P8 to be connected to nodes X1 and X4. For example, transistors P7 and P8 may be connected to nodes X2 and X5 or to nodes X0 and X3. If desired, a differential driving scheme may be used in which P7 routes data D to a true node (e.g., X0, X1, X3, or X4), whereas P8 routes complementary data ND to a complementary node (e.g., X2 or X5). An advantage of arrangements of the type shown in FIG. 5 is that they avoid the use of an additional line 32 to handle complementary data signals ND, thereby maximizing usage of available integrated circuit area.

Data loading schemes based on three address transistors or four address transistors may also be used. An advantage of twelve transistor (12T) cell configurations of the type shown in FIGS. 3 and 4 is that this type of configuration may be less complex and may consume less integrated circuit area than other configurations.

Memory cell 20 may be formed on a silicon substrate in any suitable layout. If desired, the layout of memory cell 20 on the silicon substrate may be selected to minimize the probability of cell 20 experiencing soft error upsets. For example, the probability of a multi-node upset event may be reduced if nodes are physically separated from each other on the silicon substrate. Because of the desire to physically separate the four main nodes in cell 20, a substantially square layout of cell 20 may minimize the probability of multi-node upset events. In addition, this type of layout may allow for two memory cells of the type shown in FIG. 3 or in FIG. 4 to be interleaved to allow the nodes of each of the cells 20 to be separated while minimizing the average area consumed by each cell 20 on the silicon substrate (e.g., when two cells 20 are interleaved the area consumed is substantially less than twice the area each of the cells would consume on its own).

With this type of arrangement, there may be space between the separated nodes which can be filled with other circuits. If desired, this space may be filled with pass-gates for multiplexers or other logic circuits that are controlled by cell 20 (e.g., the space may be filled with one or more programmable logic metal-oxide-semiconductor transistors 18). Minimizing the area consumed by memory cells and related components such as pass-gates is highly desirable.

Figure 6:
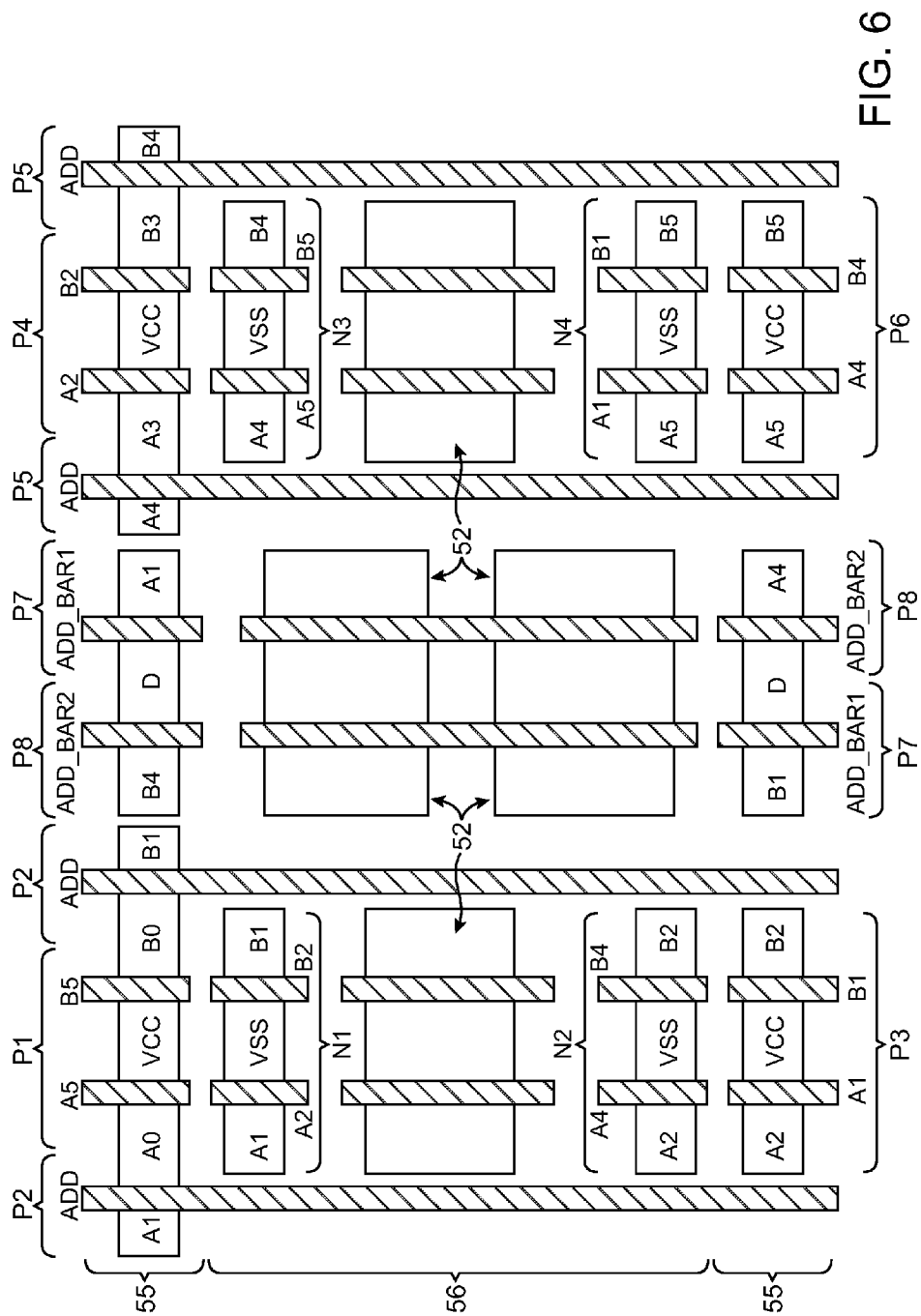
FIG. 6 is a top view of an illustrative layout for two memory cells in accordance with an embodiment of the present invention.

One potential layout for two memory cells 20 (e.g., memory cell A and memory cell B) is shown in FIG. 6. As shown in FIG. 6, cell 20 may be arranged in a substantially square layout. This is merely one possibility and, in general, any suitable arrangement may be used.

Figure 7:
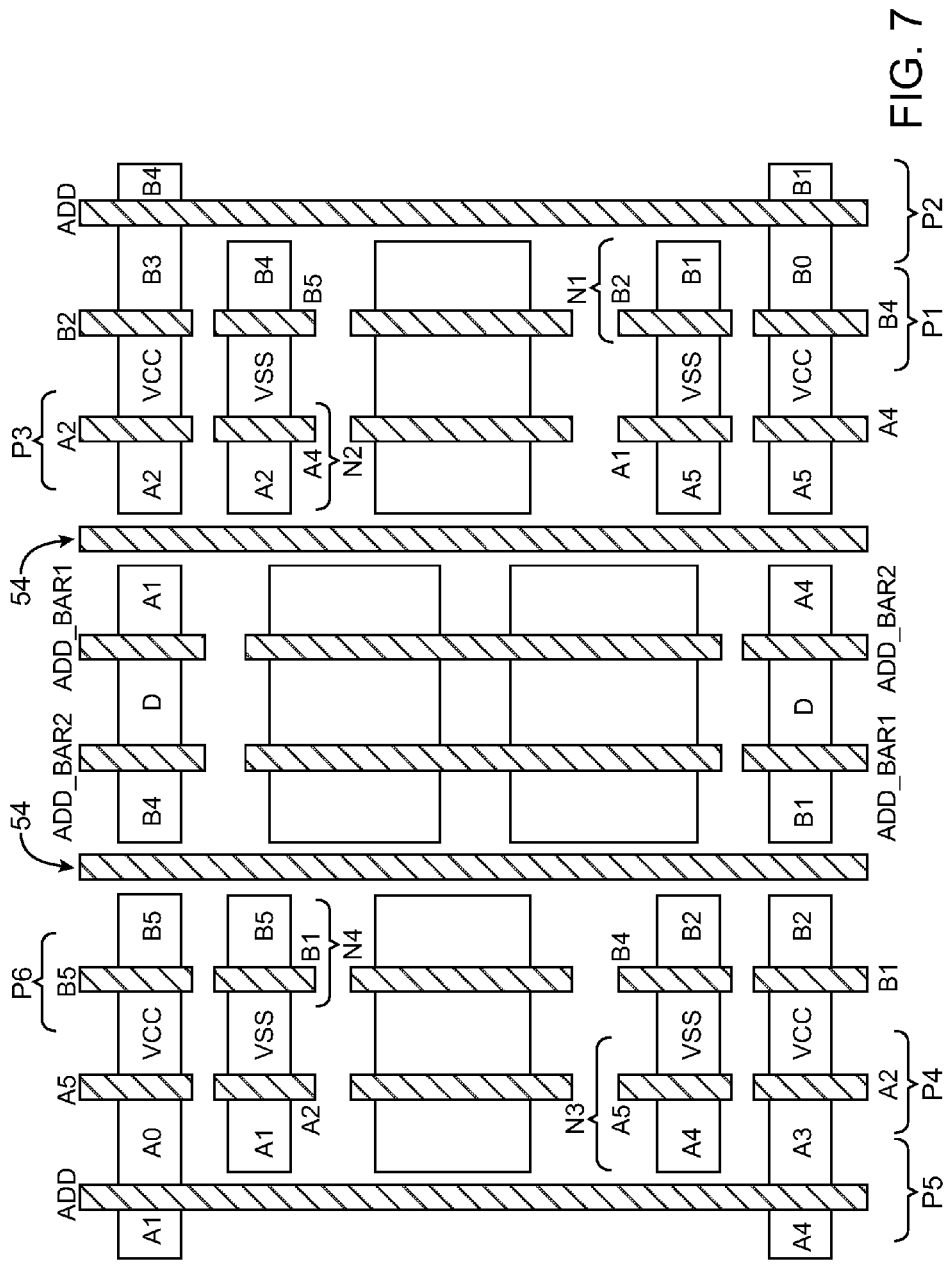
FIG. 7 is a top view of an illustrative layout for two memory cells that may have dummy lines and that may be more compact than the layout shown in FIG. 6 in accordance with an embodiment of the present invention.

Circuitry such as circuits 52 may be formed between the nodes of the two memory cells (as shown in FIGS. 6 and 7). The one suitable arrangement, circuits 52 may have pass gates that receive control signals from one or more output terminals of the two memory cells.

The layouts shown in FIGS. 6 and 7 may be particularly suitable for arrangements in which each memory cell 20 controls four pass gates. As an example, device 10 may have one or more two stage 12:1 multiplexers, each of which has a first stage with four 3:1 multiplexers and a second stage with one 4:1 multiplexer. The four 3:1 multiplexers in each 12:1 multiplexer may receive control signals from three memory cells 20 in parallel. The single 4:1 multiplexer in each 12:1 multiplexer may receive control signals from four memory cells 20. With this arrangement, there may be seven memory cells 20 used to control each 12:1 multiplexer.

The layouts shown in FIGS. 6 and 7 may be particularly suitable at providing the four 3:1 multiplexers while minimizing the circuit area consumed by the four 3:1 multiplexers and the associated memory cells 20 that control the multiplexers. The four 3:1 multiplexers can be implemented as three separate sets of four pass gates, each set being controlled by a single memory cell 20. Because circuitry 52 may include eight pass gates (e.g., circuitry 52 may include eight transistors) and the layouts of FIGS. 6 and 7 include two memory cells 20, the layouts of FIGS. 6 and 7 can be used to efficiently implement (e.g., without consuming excessive circuit area) two sets of four pass controlled in parallel gates and two memory cells 20 that can be used to control the two sets of four pass gates.

With this type of arrangement, three sets of circuitry provided in the layouts of FIG. 6 and FIG. 7 can be used to provide an efficient implementation of eight 3:1 multiplexers (e.g., the first stages of two 12:1 multiplexers). In general, the layouts of FIGS. 6 and 7 may also be used to implement multiplexers that are not 12:1. The layouts of FIGS. 6 and 7 are, however, particularly efficient when implementing sets of four pass gates that are controlled in parallel (e.g., when implementing sets of four multiplexers controlled in parallel).

The transistors of the two memory cells shown in FIG. 6 are identified in FIG. 6 and the nodes of the two memory cells are also identified. The nodes of the first memory cell are identified as A0, A1, A2, A3, A4, A5 and the nodes of the second memory cell are identified as B0, B1, B2, B3, B4, and B5 (rather than as the generic label X0, X1, X2, X3, X4, and X5 shown in FIG. 3).

As shown in FIG. 6, two memory cells 20 may be formed with a layout in which the PMOS transistors are located in regions 55 at either end of the cells, while the NMOS transistors can be located in region 56. If desired, the circuits 52 may be formed from NMOS devices. By grouping the PMOS and NMOS transistors together in this way, the memory cells may have a relatively high level of OD sharing (e.g., the transistors may share regions of the semiconductor substrate which are similarly doped), which is desirable.

Another potential layout for two memory cells 20 is shown in FIG. 7. The layout shown in FIG. 7 is similar to the layout in FIG. 6. Only the transistors whose locations are substantially different from the layout shown in FIG. 6 are labeled in FIG. 7. The nodes of memory cells (including those whose locations have not changed) are also labeled in FIG. 7.

While not shown in FIGS. 6 and 7, the two memory cells 20 will also include conductive lines that interconnect the desired nodes so that all of the common nodes are connected together (e.g., so that the A0 nodes are connected together, the B0 nodes are connected together, the A1 nodes are connected together, the B1 nodes are connected together, . . . , the A5 nodes are connected together, and the B5 nodes are connected together).

The gates of the transistors in cells 20 are illustrated by the shaded regions of FIGS. 6 and 7 and source drain regions are unshaded.

Figure 8:
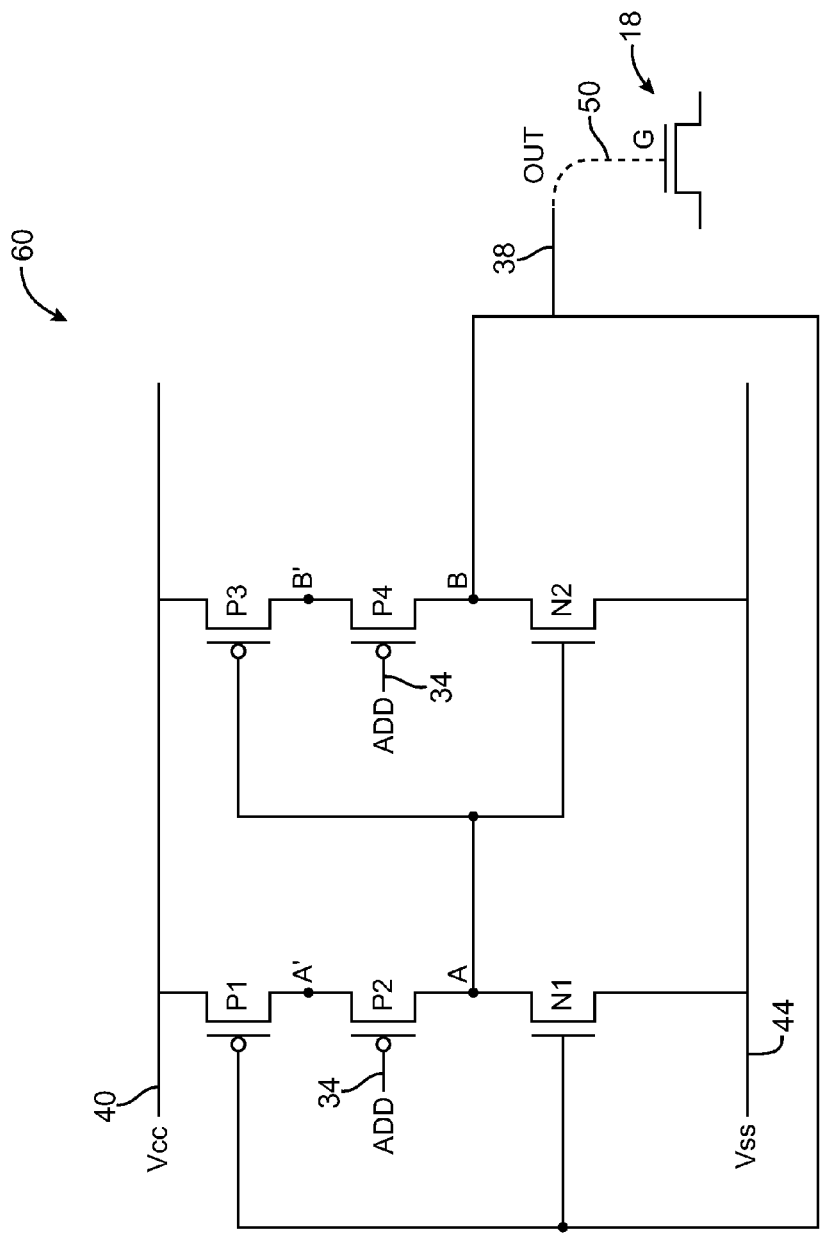
FIG. 8 is a diagram of an illustrative memory cell with two inverter-like pairs of transistors and with two write control transistors in accordance with an embodiment of the present invention.

A memory element 60 of the type that may be used in array 28 of FIG. 2 is shown in FIG. 8. As shown in FIG. 8, memory element 60 may have p-channel metal-oxide-semiconductor (PMOS) transistors P1, P2, P3, and P4 and re-channel metal-oxide-semiconductor (NMOS) transistors N1 and N2. Memory element 60 may also have NMOS and/or PMOS address transistors (not shown in FIG. 8).

Memory element 60 may be based on a pair of cross-coupled inverters. In addition, memory element 60 of FIG. 8 may have two control transistors that are in between the two inverter-like pairs of transistors (e.g., cell 60 has control transistor P2 between the transistors in the first pair and control transistor P4 between the transistors in the second pair). If desired, cell 60 may have only a single control transistor between one of the two inverter-like pairs of transistors (e.g., cell 60 may have only transistor P2 or transistor P4). Transistors between the inverter-like pairs of transistors (e.g., transistors similar to P2 and P4) may be implemented using NMOS transistors. With one suitable arrangement, control transistors in cell 60 may be between one of the transistors in an inverter-like pair of transistors and a power supply line. For example, the control transistors in cell 60 may be between a PMOS transistors in the pair of transistors and a positive power supply line and/or between an NMOS transistors in the pair of transistors and a ground power supply line.

Transistors P2 and P4 each couple together two nodes in memory element 20 (A to A' and B to B', respectively). With one suitable arrangement, transistors P2 and P4 may be isolation transistors that isolate certain nodes in element 20 during data writing operations and that couple the nodes together during other operations (i.e., during data reading and normal operations). For example, transistor P2 may isolate nodes A and A' and transistor P4 may isolate nodes B and B' during data writing operations. This type of arrangement may increase write margins. For example, isolating nodes A and B from A' and B', respectively, may allow a "0" to be written onto nodes A and B without having to overcome transistors P1 and P3 and may reduce leakage current when overdriving a "1" onto nodes A and B (e.g., because the "overdriven 1" could not leak through transistors P1 and P3 into power supply line 40).

Figure 9:
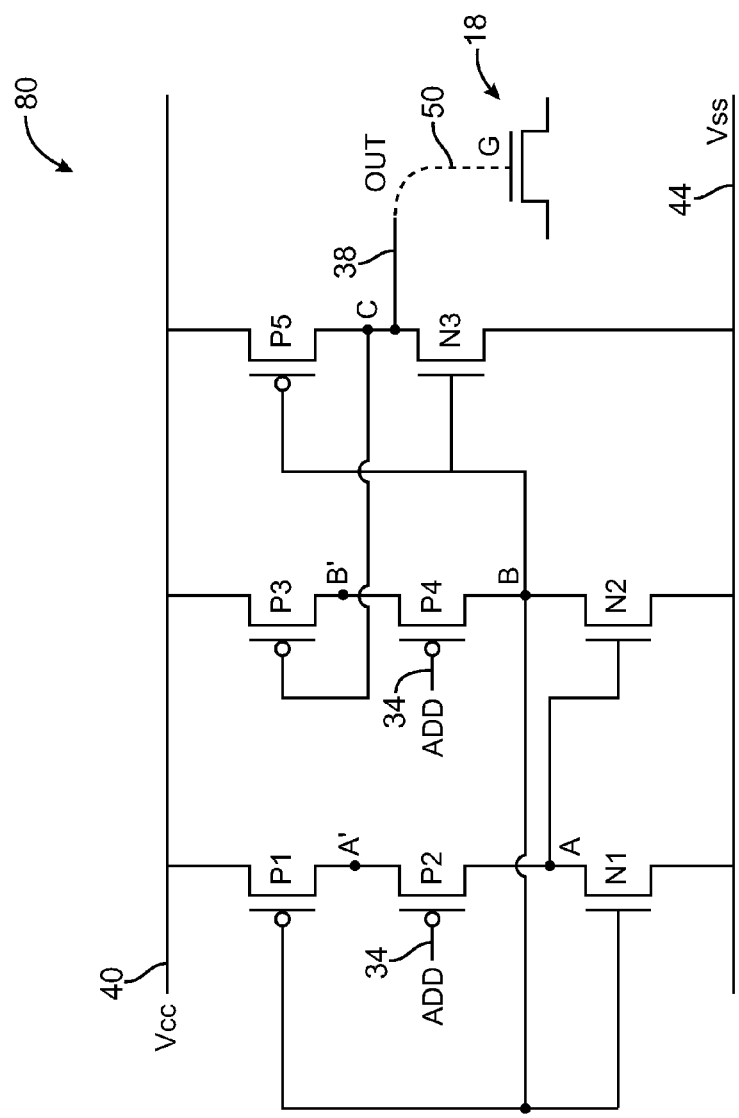
FIG. 9 is a diagram of an illustrative memory cell with three inverter-like pairs of transistors and with two write control transistors in accordance with an embodiment of the present invention.

A memory element 80 of the type that may be used in array 28 of FIG. 2 is shown in FIG. 9. As shown in FIG. 9, memory element 80 may have p-channel metal-oxide-semiconductor (PMOS) transistors P1, P2, P3, P4, and P5 and n-channel metal-oxide-semiconductor (NMOS) transistors N1, N2, and N3. Memory element 80 may also have NMOS and/or PMOS address transistors (not shown in FIG. 9).

Memory element 80 may be based on three pairs of interconnected inverter-like circuits. In addition, memory element 80 of FIG. 9 may have two control transistors that are in between two of three inverter-like pairs of transistors (e.g., cell 80 has control transistor P2 between the transistors in the first pair and control transistor P4 between the transistors in the second pair). If desired, cell 80 may have only a single control transistor between one of the three inverter-like pairs of transistors (e.g., cell 80 may have only transistor P2 or transistor P4). Alternatively, cell 80 may have three control transistors. Transistors between the inverter-like pairs of transistors (e.g., transistors similar to P2 and P4) may be implemented using NMOS transistors.

With one suitable arrangement, control transistors in cell 60 may be located between one of the transistors in an inverter-like pair of transistors and a power supply line. For example, the control transistor in cell 60 may be located between a PMOS transistor in the pair of transistors and a positive power supply line and/or between an NMOS transistor in the pair of transistors and a ground power supply line.

Transistors P2 and P4 each couple together two nodes in memory element 20 (A to A' and B to B', respectively). With one suitable arrangement, transistors P2 and P4 may be isolation transistors that isolate certain nodes in element 20 during data writing operations and that couple the nodes together during other operations (i.e., during data reading and normal operations). For example, transistor P2 may isolate nodes A and A' and transistor P4 may isolate nodes B and B' during data writing operations. This type of arrangement may increase write margins. For example, isolating nodes A and B from A' and B', respectively, may allow a "0" to be written onto nodes A and B without having to overcome transistors P1 and P3 and may reduce leakage current when overdriving a "1" onto nodes A and B (e.g., because the "overdriven 1" would not leak through transistors P1 and P3 onto power supply line 40).

With control transistors P2 and P4 on, cell 80 holds its loaded data value and exhibits good immunity to radiation-induced upset events. In particular, memory element 80 holds its loaded data value even after a radiation-induced upset event on node A, node A', node C, or line 34 (ADD).

If desired, the third inverter-like pair of transistors (e.g., the redundant node formed by transistors P5 and N3) may be moved between the first and second inverter-like pairs of transistors. With another suitable arrangement, node C may be used to control the gates of transistors P1, N1, P3, and N2, node B may be used to control the gate of transistor P5, and node A may be used to control the gate of transistor N3. These are merely illustrative examples.

If desired, one or more of the inverter-like pairs of transistors in memory cell 20 (or in memory cell 60 or 80) may be powered by a second positive power supply line and/or a second ground power supply line. With this type of arrangement, the second power supply lines may be shifted relative to power supply lines 40 and 44 to alter the behavior of the memory cell. As shown in FIG. 10 as one example of this type of arrangement, transistors P1, P2, and N1 of memory cell 20 may be powered by positive power line 100 at voltage Vcc' and by ground power line 102 at voltage Vss'.

While only transistors P1, P2, and N3 are powered by lines 100 and 102 in the FIG. 10 example, in general any of the inverter-like pairs of transistors in the memory cell may be powered by secondary power supply lines such as lines 100 and 102. If desired, any suitable number of power supply lines (e.g., two sets, three set, four sets, etc.) may be used to power memory cell 20. For example, each of the inverter-like pairs of transistors could be independently powered by a separate set of power supply lines, if desired.

With one suitable arrangement, line 100 may be at a voltage Vcc' that is greater than the voltage Vcc carried by line 40. Alternatively or in addition, line 102 may be at a voltage Vss' that is less than the voltage Vss carried by line 44. With this type of arrangement, an output voltage will be available on node X1 that has a wider range of voltages (e.g., from Vss' to Vcc') than the output voltages available on nodes X2, X4, and X5 (e.g., from Vss to Vcc). Having a wider range of output voltages may be particularly beneficial as it allows programmable logic metal-oxide-semiconductor transistor 18 to be strongly asserted or deasserted (e.g., fully turned on or fully turned off).

Because transistors P1, P2, and N1 may receive elevated power supply signals such as Vcc' and Vss' but are controlled by signals from nodes X2 and X5 and the ADD signal which may not be elevated, some or all of transistors P1, P2, and N2 may have a relatively high threshold voltage (e.g., when compared to the other transistors in memory cell 20) to help prevent leakage current. Having a relatively high threshold voltage helps to ensure that transistors P1, P2, and N2 are sufficiently turned off when a Vss or Vcc signal is asserted on their gates. As an example, if the threshold voltage of transistor N1 was too low, current could leak from node X1 to power supply line Vss' when node X2 is at Vss (e.g., the voltage difference between Vss' and Vss could be sufficient to partially turn on transistor N1, which is undesirable in this situation). With one suitable arrangement, transistors P1, P2, and N2 may have a threshold voltage high enough to ensure that transistors P1 and P2 are sufficiently turned off when node X5 and ADD are at Vcc and that transistor N2 is sufficiently turned off when node X2 is at Vss.

The illustrative arrangement shown in FIG. 10 may be one way in which a wider range of output voltages may be obtained while minimizing the risk of gate oxide breakdown in cell 20 (e.g., memory cell failure). Because only a fraction of the transistors in memory cell 20 (25% in the FIG. 10 example) are powered with elevated power supply voltages (Vcc' and Vss'), the overall risk of an oxide breakdown occurring in the transistors of cell 20 is reduced when compared to the breakdown risk in situations in which all of the transistors are powered with elevated power supply voltages.

Figure 11:
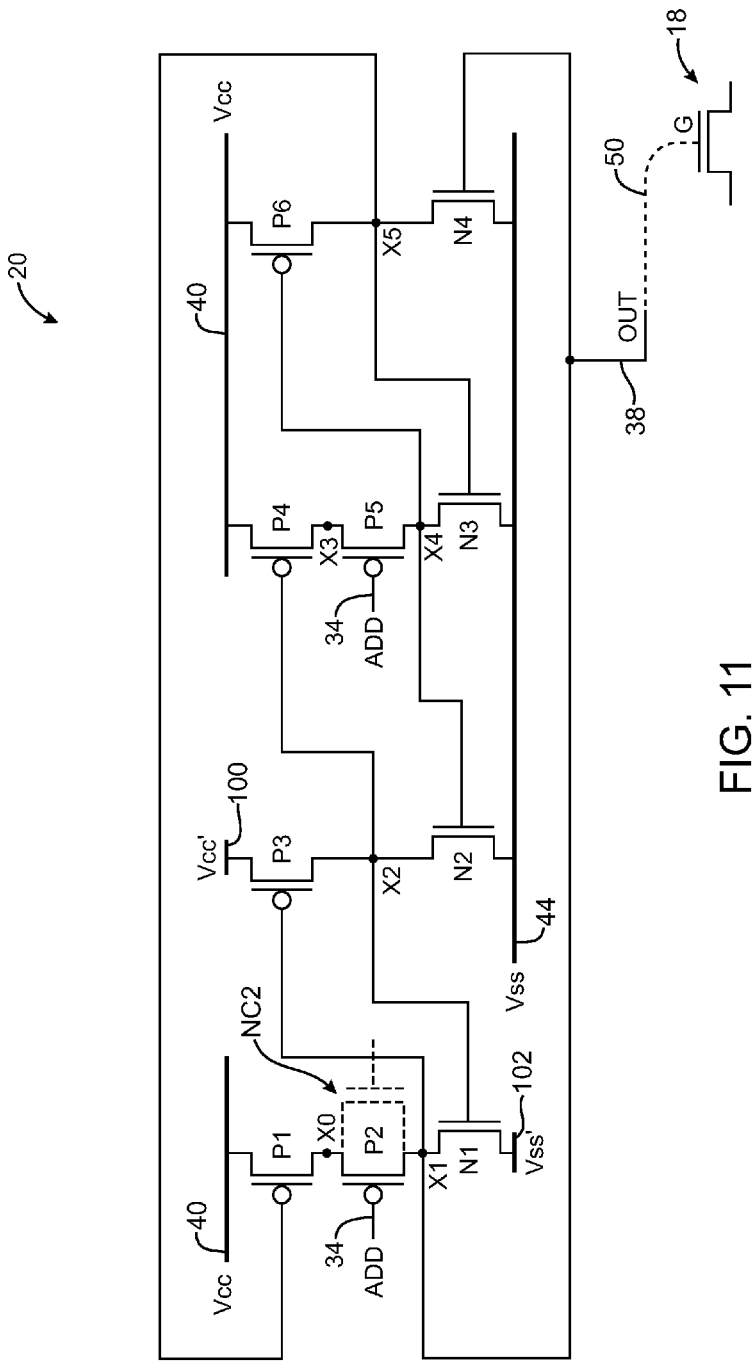
FIG. 11 is a diagram of an illustrative memory cell that has pairs of transistors that are powered by a first set of power supply lines, a pair of transistors that are powered by a positive power supply line in the first set of power supply lines and a ground power supply line in a second set of power supply lines, and a pair of transistors that are powered by a ground power supply line in the first set of power supply lines and a positive power supply line in the second set of power supply lines in accordance with an embodiment of the present invention.

If desired, at least a first one of the inverter-like pairs of transistors in memory cell 20 (or in memory cell 60 or 80) may be powered by a second ground power supply line while at least one a second one of the inverter-like pairs of transistors may be powered by a second positive power supply line. With this type of arrangement, the second power supply lines may be shifted relative to power supply lines 40 and 44 to alter the behavior of the memory cell. As shown in FIG. 11 as one example of this type of arrangement, transistors P1, P2, and N1 of memory cell 20 may be powered by positive power line 40 at voltage Vcc and ground power line 102 at voltage Vss' while transistors P3 and N2 may be powered by positive power line 100 at voltage Vcc' and ground power line 44 at voltage Vss.

While only transistors P1, P2, N3, P3, and N2 are powered by the second set of power supply lines 100 and 102 in the FIG. 11 example, in general any of the inverter-like pairs of transistors in the memory cell may be partially or fully powered by secondary power supply lines such as lines 100 and 102. If desired, any suitable number of power supply lines (e.g., one set, two sets, three sets, four sets, etc.) may be used to power memory cell 20.

As shown in FIG. 11, programmable logic metal-oxide-semiconductor transistor 18 may be implemented as a p-channel metal-oxide-semiconductor (PMOS) transistor. This is merely an example, and if desired transistor 18 may be implemented as an NMOS transistor.

With one suitable arrangement, line 100 may be at a voltage Vcc' that is less than the voltage Vcc carried by line 40 (e.g., voltage Vcc' may be a lowered power supply voltage). Alternatively or in addition, line 102 may be at a voltage Vss' that is less than the voltage Vss carried by line 44.

When node X1 is low (e.g., node X1 is at voltage Vss'), gate G of transistor 18 may receive a control signal at voltage Vss' and transistor 18 may be overdriven (e.g., turned on strongly). In addition, because transistors P3 and N2 may be powered by a lowered power supply voltage Vcc', the gate-source voltage across transistor N1 will be limited to the difference of Vcc' and Vss' (e.g., the gate-source voltage of transistor N1 may be 1.05 volts when Vcc' is 0.65 volts and Vss' is –0.4 volts), which may help to ensure that transistor N1 and cell 20 are not overstressed (e.g., circuit design limits are not exceeded). In contrast, if transistors P3 and N2 were powered by a power supply voltage Vcc' equal to Vcc, the gate-source voltage across transistor N1 would be increased (e.g., the gate-source voltage of transistor N1 may be 1.25 volts when Vcc' and Vcc are 0.85 volts and Vss' is –0.4 volts) and could overstress the transistor, exceed circuit design limits, and potentially lead to the failure of transistor N1 and cell 20.

When node X1 is high (e.g., node X1 is at voltage Vcc, gate G of transistor 18 may receive a control signal at voltage Vcc and transistor 18 may be turned off.

In general, PMOS transistors can withstand larger gate-source voltages than NMOS transistors. So while the gate-source voltage of transistor 18 may be relatively larger than the gate-source voltage of transistor N1, when node X1 is low, the PMOS transistor 18 may remain within circuit design limits. As an example, the gate-source voltage of transistor 18, when node X1 is at Vss' and transistor 18 has a source-drain terminal connected to power supply line Vcc, may be 1.25 volts (e.g., when voltage Vcc is 0.85 volts and voltage Vss' is –0.4 volts). Because transistor 18 is a PMOS transistor, transistor 18 may be better able to withstand the increased gate-source voltage without being overstressed.

With one suitable arrangement, transistor N1 may have a relatively high threshold voltage (e.g., when compared to the other transistors in cell 20) to help prevent leakage current. Having a relatively high threshold voltage helps to ensure that transistor N1 is sufficiently turned off when a power supply signal Vss that may be greater than power supply signal Vss' is asserted on the gate of transistor N1. As an example, if the threshold voltage of transistor N1 was too low, current could leak from node X1 to power supply line Vss' when node X2 is at Vss (e.g., the voltage difference between Vss' and Vss could be sufficient to partially turn on transistor N1, which is undesirable in this situation).

As an example, voltages Vcc, Vcc', Vss, and Vss' may be approximately equal to 0.85 volts, 0.65 volts, –0.2 volts, and –0.4 volts, respectively. With this type of arrangement, a wider range of output voltages may be available without over stressing the transistors in cell 20 (e.g., without exceeding circuit design limits). In general, any suitable power supply voltages may be used.

In general, the elevated power supply voltages Vcc' and Vss' may be within the operating range of transistors in cell 20. For example, even when transistors such as transistors P1, P2, and N1 which receive overdriven power supply voltage Vss', the transistors may not be overdriven beyond their rated capacity and the power supply voltages the transistors receive may be within pre-defined limits (e.g., within a range of power supply voltages deemed suitable by a integrated circuit manufacturer producing integrated circuit 10).

As shown by the dashed outline of NMOS transistor NC2 in FIG. 11, control transistors in cell 20 of FIG. 11 such as P2 and P5 (or the control transistors in any of the other memory cells) may be implemented as NMOS transistors if desired.

If desired, memory cells 60 and 80 of FIGS. 8 and 9, respectively, may implement one of the arrangements shown in FIGS. 10 and 11 in which one or more sets of transistors are at least partially powered by a secondary set of power supply lines (e.g., lines 100 and 102). For example, transistors P3, P4, and N2 of FIG. 8 may be powered by power supply lines such as lines 100 and 102 while transistors P1, P2, and N1 of FIG. 8 are powered by power supply lines 40 and 44. In another example, transistors P5 and N3 of FIG. 9 may be powered by power supply lines such as lines 100 and 102 while the other transistors of cell 80 are powered by power supply lines 40 and 44. These are merely illustrative examples and, in general, any suitable arrangement may be used.

The memory cells shown in FIGS. 8, 9, 10, and 11 may include address transistors such as address transistors P7 and P8 of FIG. 5. Data D can be conveyed to memory elements such as cells 20, 60, and 80 over a single data line 32 through address transistors P7 and P8. If desired, data can be conveyed to any of the memory elements shown in FIGS. 8, 9, 10, and 11 using a differential data writing scheme. For example, a true data line may be used to drive data onto node A of memory cells 60 and 80 while a complimentary data line can be used to drive data onto node B of memory cells 60 and 80. In addition or alternatively, the true data line may be used to drive data onto node C of cell 80.

As described in connection with FIGS. 6 and 7, memory cell 20 may be formed on a silicon substrate in any suitable layout. The layout of cell 20 on the silicon substrate may be selected to minimize the probability of cell 20 experiencing multi-node upset events while also minimizing the area consumed by each cell 20.

Figure 12:
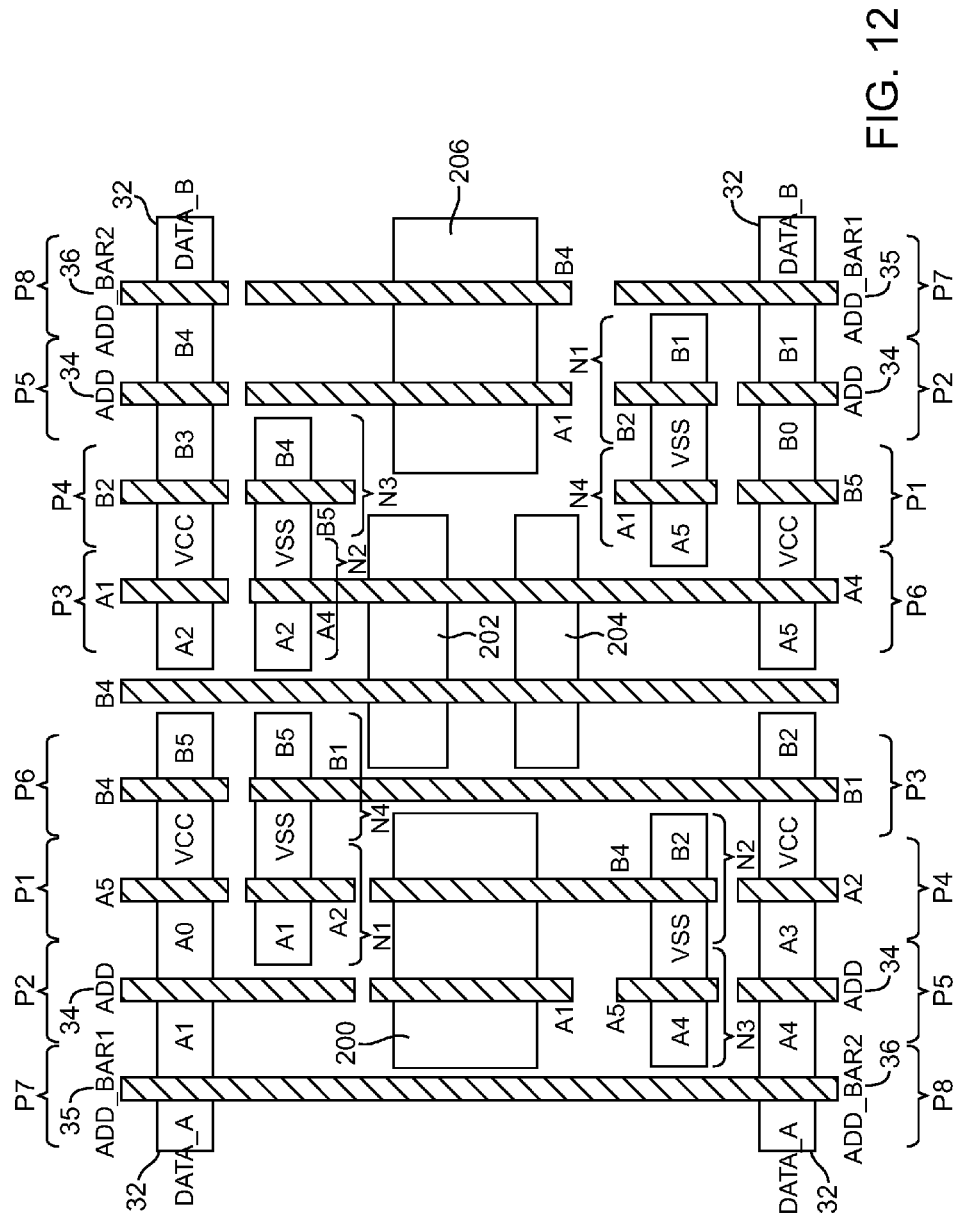
FIG. 12 is a top view of an illustrative layout for two memory cells that may include eight pass transistors in accordance with an embodiment of the present invention.

One potential layout for two memory cells 20 (e.g., memory cell A and memory cell B) is shown in FIG. 12. As shown in FIG. 12, two memory cells 20 may be interleaved and arranged in a substantially square layout.

With this type of arrangement, there may be space between the separated nodes of the two cells 20 that can be filled with transistors or other circuit components. As an example, this space may be filled with eight pass-gate transistors. Four of the eight pass-gate transistors may be controlled in parallel by memory cell A and four of the eight pass-gate transistors may be controlled in parallel by memory cell B. If desired, three pairs of two memory cells and circuit blocks 200, 202, 204, and 206 (each of which may be arranged using the layout of FIG. 12 or another suitable layout) may be used to implement eight 3:1 multiplexers (e.g., the first stages of two 12:1 multiplexers).

With one suitable arrangement, circuit blocks 200 and 206 may each include a pass transistor with a gate coupled to node A1 (e.g., node X1 of cell A) and a pass transistor with a gate coupled to node B4 (e.g., node X4 of cell B). Circuit blocks 202 and 204 may each include a pass transistor with a gate coupled to node B4 and a pass transistor with a gate coupled to node A4.

Any suitable number of the transistors in circuit blocks 200, 202, 204, and 206 may be implemented as NMOS transistors and any suitable number of the transistors in circuit blocks 200, 202, 204, and 206 may be implemented as PMOS transistors. With one suitable arrangement, each of the transistors in blocks 200, 202, 204, and 206 may be implemented as PMOS transistors (e.g., the transistors may be p-channel metal-oxide-semiconductor passgates).

The foregoing is merely illustrative of the principles of this invention and various modifications can be made by those skilled in the art without departing from the scope and spirit of the invention.

What is claimed is:

1. A memory element comprising:
   first and second pairs of transistors that are interconnected to form a bistable element having two nodes, each node being coupled between an n-channel transistor and a p-channel transistor in a respective one of the first and second pairs of transistors;
   only one control transistor coupled in series with the first pair of transistors between a pair of power supply lines, wherein the control transistor is configured to control the first pair of transistors; and
   a third transistor pair that is interconnected with the first and second transistor pairs to form the bistable element, wherein the bistable element has a third node, the third node being coupled between an n-channel transistor and a p-channel transistor in the third transistor pair.

2. The memory element defined in claim 1 further comprising:
   a second control transistor, wherein the second control transistor is configured to control the second pair of transistors, and wherein the second pair of transistors and the second control transistor are coupled between the pair of power supply lines.

3. The memory element defined in claim 1 wherein the pair of power supply lines comprises a positive power supply line and a negative power supply line, wherein the first pair or transistors and the control transistor have source-drain terminals, and wherein the first pair of transistors and the control transistor are coupled in series through their source-drain terminals between the pair of power supply lines.

4. The memory element defined in claim 1 wherein the control transistor comprises a p-channel transistor and wherein the control transistor and the p-channel transistor in the first pair of transistors are coupled in series between a first one of the pair of power supply lines and the node that is coupled between the first pair of transistors.

5. The memory element defined in claim 4 wherein the control transistor is coupled between the p-channel transistor in the first pair of transistors and the first one of the pair of power supply lines.

6. The memory element defined in claim 4 wherein the p-channel transistor in the first pair of transistors is coupled between the control transistor and the first one of the pair of power supply lines.

7. The memory element defined in claim 1 further comprising:
   an address transistor coupled to a first one of the two nodes.

8. The memory element defined in claim 7 further comprising:
   an additional address transistor coupled to a second one of the two nodes.

9. The memory element defined in claim 1, further comprising:
   a fourth transistor pair that is interconnected with the first, second, and third transistor pairs to form the bistable element, wherein the bistable element has a fourth node, the fourth node being coupled between an n-channel transistor and a p-channel transistor in the fourth transistor pair.

10. The memory element defined in claim 1 further comprising:
a second control transistor, wherein the second control transistor is associated with the second pair of transistors, wherein the first pair of transistors and the control transistor are coupled in series between the pair of power supply lines, and wherein the second pair of transistors and the second control transistor are coupled in series between the pair of power supply lines.

11. The memory element defined in claim 1, wherein the pair of power supply lines includes a first power supply line operable to carry a first voltage and a second power supply line operable to carry a second voltage that is lower than the first voltage, wherein the second pair of transistors is coupled to an additional pair of power supply lines, and wherein the additional pair of power supply lines includes a third power supply line operable to carry a third voltage that is less than the first voltage.

12. The memory element defined in claim 11, wherein the additional pair of power supply lines further includes a fourth power supply line operable to carry a fourth voltage that is greater than the third voltage.

13. A memory element comprising:
first and second pairs of transistors that are interconnected to form a bistable element having two nodes, each node being coupled between an n-channel transistor and a p-channel transistor in a respective one of the first and second pairs of transistors;
a first control transistor, wherein the first pair of transistors and the first control transistor are coupled in series between a pair of power supply lines; and
a second control transistor, wherein the second pair of transistors and the second control transistor are coupled in series between the pair of power supply lines, wherein the first and second control transistors comprise p-channel transistors that receive a control signal, wherein the first and second control transistors are simultaneously activated when the control signal is asserted.

14. The memory element defined in claim 13, wherein the first and second control transistors each comprise a gate, further comprising:
a control line configured to receive the control signal.

15. The memory element defined in claim 14, wherein the gate of the first control transistor and the gate of the second control transistor are coupled to the control line.

16. A memory element comprising:
a first pair of power supply lines on which a first set of voltage levels is applied;
a second pair of power supply lines on which a second set of voltage levels is applied, wherein the first set of voltage levels is different than the second set of voltage levels;
first and second pairs of transistors that are interconnected to form a bistable element having two nodes, each node being coupled between an n-channel transistor and a p-channel transistor in a respective one of the first and second pairs of transistors, wherein each of the first and second pairs of transistors has an input and an output, wherein the input of the first pair of transistors is coupled to the output of the second pair of transistors, and wherein the output of the first pair of transistors is coupled to the input of the second pair of transistors; and
a control transistor, wherein the control transistor is associated with the first pair of transistors, wherein the first pair of transistors and the control transistor are coupled in series between the first pair of power supply lines, and wherein the second pair of transistors is coupled between the second pair of power supply lines.

17. The memory element defined in claim 16 further comprising:
a second control transistor, wherein the second pair of transistors and the second control transistor are coupled in series between the second pair of power supply lines.

18. The memory element defined in claim 17, wherein:
the first pair of power supply lines comprises a first positive power supply line on which a first positive voltage is provided and a first ground power supply line on which a first ground voltage is provided;
the second pair of power supply lines comprises a second positive power supply line on which a second positive voltage is provided and a second ground power supply line on which a second ground voltage is provided;
the first positive voltage is greater than the second positive voltage; and
the first ground voltage is less than the second ground voltage.

19. A memory element comprising:
a first pair of power supply lines on which a first set of voltage levels is applied;
a second pair of power supply lines on which a second set of voltage levels is applied, wherein the first set of voltage levels is different than the second set of voltage levels;
first and second pairs of transistors that are interconnected to form a bistable element having two nodes, each node being coupled between an n-channel transistor and a p-channel transistor in a respective one of the first and second pairs of transistors; and
a control transistor that is coupled in series with the n-channel and p-channel transistors in the first pair of transistors between the first pair of power supply lines, wherein the control transistor and the n-channel and p-channel transistors in the first pair of transistors are each coupled to different conductive lines, and wherein the second pair of transistors is coupled between the second pair of power supply lines.

* * * * *